(12) United States Patent
Maki

(10) Patent No.: US 10,812,092 B2
(45) Date of Patent: Oct. 20, 2020

(54) FREQUENCY SIGNAL GENERATION DEVICE AND FREQUENCY SIGNAL GENERATION SYSTEM

(71) Applicant: Seiko Epson Corporation, Tokyo (JP)

(72) Inventor: Yoshiyuki Maki, Suwa (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 16/117,580

(22) Filed: Aug. 30, 2018

(65) Prior Publication Data

US 2019/0068208 A1 Feb. 28, 2019

(30) Foreign Application Priority Data

Aug. 31, 2017 (JP) .................... 2017-168094

(51) Int. Cl.
| | | |
|---|---|---|
| H01S 1/06 | (2006.01) | |
| H03B 17/00 | (2006.01) | |
| H03L 7/26 | (2006.01) | |
| G04F 5/14 | (2006.01) | |

(52) U.S. Cl.
CPC . H03L 7/26 (2013.01); G04F 5/14 (2013.01)

(58) Field of Classification Search
CPC .................................. H03L 7/26; G04F 5/14
USPC ..................................... 331/3, 94.1
See application file for complete search history.

(56) References Cited

U.S. PATENT DOCUMENTS

| | | | | |
|---|---|---|---|---|
| 2001/0005649 | A1 | 6/2001 | Fujioka | |
| 2015/0061785 | A1* | 3/2015 | Ishihara | H03L 7/26 |
| | | | | 331/94.1 |
| 2015/0072540 | A1 | 3/2015 | Sasaki | |
| 2015/0270844 | A1* | 9/2015 | Maki | H03L 7/26 |
| | | | | 331/94.1 |
| 2019/0109597 | A1* | 4/2019 | Matsuda | H03L 7/26 |

FOREIGN PATENT DOCUMENTS

| | | |
|---|---|---|
| JP | 06-006055 A | 1/1994 |
| JP | 06-216550 A | 8/1994 |
| JP | 07-122864 A | 5/1995 |
| JP | 08-051289 A | 2/1996 |
| JP | 09-298375 A | 11/1997 |
| JP | 11-298171 A | 10/1999 |
| JP | 2001-044671 A | 2/2001 |
| JP | 2001-185880 A | 7/2001 |
| JP | 2003-189339 A | 7/2003 |
| JP | 2004-103636 A | 4/2004 |
| JP | 2005-158847 A | 6/2005 |
| JP | 2006-210967 A | 8/2006 |
| JP | 2011-192904 A | 9/2011 |

(Continued)

*Primary Examiner* — Richard Tan
(74) *Attorney, Agent, or Firm* — Harness, Dickey & Pierce, P.L.C.

(57) ABSTRACT

A frequency signal generation device includes a substrate, a light source that is disposed on a surface of the substrate, and an atom cell that is disposed on the surface of the substrate. The atom cell contains gaseous alkali metal atoms and includes a first portion through which light emitted from the light source passes, a second portion housing a liquid alkali metal atom, and a third portion which connects the first portion to the second portion. A marker is provided that indicates a direction in which the liquid alkali metal atoms move to the third portion by gravity when the surface is vertically oriented.

8 Claims, 29 Drawing Sheets

(56) References Cited

FOREIGN PATENT DOCUMENTS

| JP | 2012-186358 A | 9/2012 |
| JP | 2015-002447 A | 1/2015 |
| JP | 2015-056497 A | 3/2015 |
| JP | 2016-082076 A | 5/2016 |

* cited by examiner

FREQUENCY SIGNAL GENERATION DEVICE AND FREQUENCY SIGNAL GENERATION SYSTEM

BACKGROUND

1. Technical Field

The present invention relates to a frequency signal generation device and a frequency signal generation system.

2. Related Art

Known frequency signal generation devices include atomic oscillators that oscillate based on energy transition of alkali metal atoms such as rubidium or cesium.

As such an atomic oscillator, JP-A-2015-2447 discloses a configuration in which a light source and an atom cell are disposed side by side on a substrate. During use, the atomic oscillator is used in an essentially horizontal state in which the substrate is located lower than both the light source and the atom cell (i.e., lower in a direction in which gravity acts).

In such an atomic oscillator, an amount of gaseous alkali metal atoms captured in the atom cell may decrease after a long-time of use. Even in such a case, the liquid alkali metal atoms are contained in the atom cell in order to maintain a saturated vapor pressure of the alkali metal atoms inside the atom cell.

However, when a device including an atomic oscillator, for example, a timing module, is used in a base station or the like, the atomic oscillator is sometimes received in a vertical orientation (in a state in which the surface of the substrate on which the atom cell is disposed is oriented upright so as to be aligned with the direction in which gravity acts) on a rack or the like in order to save a space. Depending on an orientation of the atomic oscillator relative to vertical, the liquid alkali metal atoms received in the atom cell may move toward a region through which light passes due to gravity (a region through which light emitted from the light source passes), and thus a frequency of the atomic oscillator may be changed.

SUMMARY

An advantage of some aspects of the invention is to provide a frequency signal generation device capable of assisting a user in recognizing a disposition direction in which liquid alkali metal atoms rarely move into a light passage portion due to gravity. Another advantage of some aspects of the invention is to provide a frequency signal generation system capable of assisting a user in recognizing a disposition direction in which liquid alkali metal atoms rarely move into a light passage portion due to gravity.

The invention can be implemented as the following forms or application examples.

Application Example 1

A frequency signal generation device according to this application example includes: a substrate; a light source that is disposed on a surface of the substrate; an atom cell disposed on the surface of the substrate, the atom cell containing gaseous alkali metal atoms and including a first portion through which light emitted from the light source passes, a second portion in which there are liquid alkali metal atoms, and a third portion which connects the first portion to the second portion; and a marker that indicates a direction in which the liquid alkali metal atoms move to the third portion by gravity when the surface is uprightly oriented (substantially vertical or aligned with a gravitational direction).

In the frequency signal generation device according to this application example, the atom cell includes the first portion through which the light emitted from the light source passes, the second portion in which there are liquid alkali metal atoms, and the third portion which connects the first portion to the second portion. Therefore, when the liquid alkali metal atoms in the second portion becomes close to the first portion, the liquid alkali metal atoms passes through the third portion. When the surface of the substrate is oriented in the gravity direction, the user can recognize a direction in which the liquid alkali metal atoms move because of gravity in accordance with the marker indicating the direction in which the liquid alkali metal atoms move to the third portion because of gravity. Accordingly, the marker can assist the user so that the user can recognize the direction of disposition in which the liquid alkali metal atoms rarely move into a passage portion of the light.

Application Example 2

In the frequency signal generation device according to the application example, the atom cell may include an inner surface defining a space in which there are the gaseous alkali metal atoms and the liquid alkali metal atoms. The first portion may include a first region of the inner surface through which the light passes and a first space portion of the space through which the light passes. The second portion may include a second region of the inner surface in which there are the liquid alkali metal atoms and a second space portion of the space in which there are the liquid alkali metal atoms. The third portion may be at least one of a third region of the inner surface connecting the first region to the second region and a third space portion of the space connecting the first space portion to the second space portion.

In the frequency signal generation device according to this application example, the atom cell includes an inner surface defining a space in which there are the gaseous alkali metal atoms and the liquid alkali metal atoms. The third portion is at least one of the third region of the inner surface connecting the first region of the inner surface through which the light passes to the second region of the inner surface in which there are the liquid alkali metal atoms, and the third portion of the space connecting the first portion of the space through which the light passes to the second portion of the space in which there are the liquid alkali metal atoms. Accordingly, when the surface of the substrate is oriented in the gravity direction, the user can recognize the direction in which the liquid alkali metal atoms move in accordance with the marker even when the liquid alkali metal atoms move to one of the third region of the inner surface and the third portion of the space of the atom cell because of gravity.

Application Example 3

The frequency signal generation device according to the application example may further include a container that accommodates the substrate, the light source, and the atom cell. The marker may be at least one of a display member on which text or a symbol attached to the container is displayed, the container to which at least one of text and a symbol is attached, and a structure installed in the container.

In the frequency signal generation device according to this application example, in accordance with at least one of the display member attached to the container accommodating the atom cell, the container accommodating the atom cell, and the structure installed in the container, the user can easily recognize the direction in which the liquid alkali metal atoms move to the third portion because of gravity when the surface of the substrate is oriented in the gravity direction.

Application Example 4

The frequency signal generation device according to the application example may further include a container that accommodates the substrate, the light source, and the atom cell; and a disposition substrate in which the container is disposed. The marker may be at least one of the disposition substrate, a structure in which the disposition substrate is installed, and a display member on which at least one of text and a symbol attached to the disposition substrate is displayed.

In the frequency signal generation device according to this application example, in accordance with at least one of the disposition substrate in which the container accommodating the atom cell is disposed, the structure installed on the disposition substrate, and the display member attached to the disposition substrate, the user can easily recognize the direction in which the liquid alkali metal atoms move to the third portion because of gravity when the surface of the substrate is oriented in the gravity direction.

Application Example 5

In the frequency signal generation device according to the application example, the marker may be the structure which is installed on the disposition substrate. When the frequency signal generation device is inserted into an opening formed in a rack by orienting the surface in the gravity direction and the liquid alkali metal atoms move to the third portion because of gravity, the structure installed on the disposition substrate may be a stopper coming into contact with the rack to hinder the frequency signal generation device from being inserted into the opening.

In the frequency signal generation device according to this application example, the marker is the stopper coming into contact with the rack to hinder the frequency signal generation device from being inserted into the opening of the rack. The user can more reliably recognize the direction in which the liquid alkali metal atoms move to the third portion because of gravity.

Application Example 6

In the frequency signal generation device according to the application example, the disposition substrate may face the substrate. The marker may be the disposition substrate. When viewed in a normal direction of a surface of the disposition substrate in which the container is disposed, a length of the disposition substrate in a direction in which the liquid alkali metal atoms move to the third portion because of gravity may be greater than a length of the opening in the gravity direction, the opening of the rack into which the frequency signal generation device is inserted by orienting the surface of the substrate in the gravity direction.

In the frequency signal generation device according to this application example, the disposition substrate is the marker. Thus, the user can recognize the direction in which the liquid alkali metal atoms move to the third portion because of gravity.

Application Example 7

In the frequency signal generation device according to the application example, the atom cell may include a cavity through which the light emitted from the light source passes and a reservoir in which there are the liquid alkali metal atoms.

In the frequency signal generation device according to this application example, the atom cell includes the cavity through which the light emitted from the light source passes and the reservoir in which there are the liquid alkali metal atoms. Therefore, the liquid alkali metal atoms can rarely have an influence on an energy state of the gaseous alkali metal atoms in the first portion. Accordingly, it is possible to reduce the influence of the liquid alkali metal atoms on a frequency of the frequency signal generation device in the application example.

Application Example 8

In the frequency signal generation device according to the application example, the atom cell may include a wall between the cavity and the reservoir. A hole connecting the cavity to the reservoir may be formed in the wall.

In the frequency signal generation device according to this application example, by separating the reservoir from the cavity by the wall, it is possible to prevent the liquid alkali metal atoms in the reservoir from having an influence on the gaseous alkali metal atoms in the cavity. In addition, it is possible to cause the cavity to enter a saturated vapor pressure of the alkali metal atoms via a hole.

Application Example 9

In the frequency signal generation device according to the application example, the atom cell may include a cavity including the first portion and the second portion. When viewed in a direction in which the light is incident on the atom cell, a distance between a center of the first portion and the liquid alkali metal atoms may be greater than a distance between the center of the first portion and a center of the cavity.

In the frequency signal generation device according to this application example, the distance between the center of the first portion and the center of the cavity is shorter than the distance between the center of the first portion and the liquid alkali metal atoms. Therefore, it is possible to increase the distance between the light emitted from the light source and the liquid alkali metal atoms.

Application Example 10

A frequency signal generation system according to this application example includes: a substrate; a light source that is disposed on a surface of the substrate; an atom cell that contains a gaseous alkali metal atom, includes a first portion through which light emitted from the light source passes, a second portion in which there are liquid alkali metal atoms, and a third portion which connects the first portion to the second portion, and is disposed on the surface; a sensor that detects a direction in which gravity acts; and an output device that performs an output based on a detection result of the sensor when the liquid alkali metal atoms move to the third portion at least because of gravity.

In the frequency signal generation system according to this application example, the atom cell includes the first portion through which the light emitted from the light source passes, the second portion in which there are liquid alkali metal atoms, and the third portion which connects the first portion to the second portion. Therefore, when the liquid alkali metal atoms in the second portion becomes close to the first portion, the liquid alkali metal atoms passes through the third portion. Then, by causing a notification device to notify the user of the direction in which the liquid alkali metal atoms move to the third portion because of gravity based on the detection result of the sensor detecting the direction in which gravity acts, it is possible to assist the user so that the user can recognize the direction of disposition in which the liquid alkali metal atoms rarely move to the first portion because of gravity.

Application Example 12

A frequency signal generation system according to this application example includes: a frequency signal generation device which includes a substrate, a light source that is disposed on a surface of the substrate, an atom cell that contains a gaseous alkali metal atom, includes a first portion through which light emitted from the light source passes, a second portion in which there are liquid alkali metal atoms, and a third portion which connects the first portion to the second portion, and is disposed on the surface, a container that accommodates the substrate, the light source, and the atom cell, and a disposition substrate in which the container is disposed and faces the substrate; and a rack that includes an opening into which the frequency signal generation device is inserted by orienting the surface of the substrate in a gravity direction. When viewed in a normal direction of a surface of the disposition substrate on which the container is disposed, a length of the disposition substrate in a first direction which is a movement direction of the liquid alkali metal atoms to the third portion because of gravity is different from a length of the disposition substrate in a second direction perpendicular to the normal line and the first direction. A difference between the length in the first direction and the length in a longitudinal direction of the opening is greater than a difference between the length in the second direction and a length in a longitudinal direction of the opening.

In the frequency signal generation system according to this application example, the atom cell includes the first portion through which the light emitted from the light source passes, the second portion in which there are liquid alkali metal atoms, and the third portion which connects the first portion to the second portion. Therefore, when the liquid alkali metal atoms in the second portion becomes close to the first portion, the liquid alkali metal atoms passes through the third portion. When viewed in the normal direction of the surface of the disposition substrate, the length of the disposition substrate in the first direction which is the movement direction of the liquid alkali metal atoms to the third portion because of gravity is different from the length of the disposition substrate in the second direction perpendicular to the normal line and the first direction. The difference between the length in the first direction and the length in the longitudinal direction of the opening is greater than the difference between the length in the second direction and the length in the longitudinal direction of the opening. Therefore, it is possible to assist the user so that the user can recognize the direction of disposition in which the liquid alkali metal atoms rarely move to the first portion because of gravity.

BRIEF DESCRIPTION OF THE DRAWINGS

Embodiments of the invention will be described with reference to the accompanying drawings, wherein like numbers reference like elements.

DESCRIPTION OF EXEMPLARY EMBODIMENTS

Hereinafter, preferred embodiments of the invention will be described in detail with reference to the drawings. The embodiments to be described below do not limit the scope of the invention described in the appended claims. All of the configurations described below may not be requirements of the invention.

1. First Embodiment 1.1 Atomic Oscillator
1.1.1. Configuration

Figure 1:
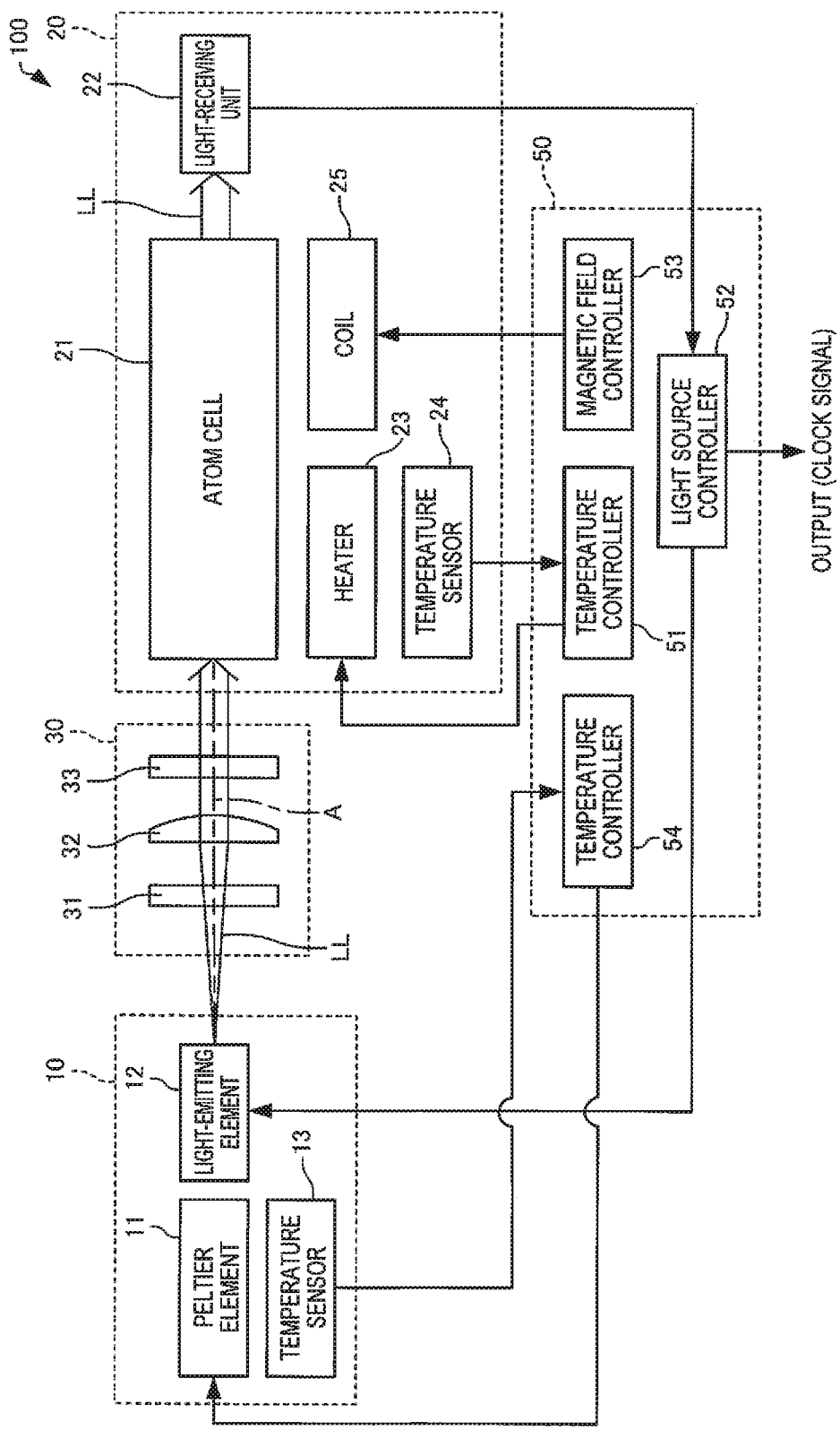
FIG. 1 is a schematic view illustrating a frequency signal generation device according to a first embodiment.

First, a frequency signal generation device according to a first embodiment will be described with reference to the drawings. FIG. 1 is a schematic view illustrating a frequency signal generation device 100 according to a first embodiment.

The frequency signal generation device 100 is an atomic oscillator that uses coherent population trapping (CPT) for producing a phenomenon in which two fields of resonance light are transmitted without being absorbed by alkali metal atoms when the two fields of resonance light with different specific wavelengths are simultaneously radiated to the alkali metal atoms. The phenomenon caused by the coherent population trapping is also referred to as an electromagnetically induced transparency (EIT) phenomenon. The frequency signal generation device according to the invention may be an atomic oscillator that uses a double resonance phenomenon by light and microwaves.

As illustrated in FIG. 1, the frequency signal generation device 100 includes a light-emitting element module 10, an atom cell unit 20, an optical system unit 30 installed between the light-emitting element module 10 and the atom cell unit 20, and a control unit 50 (controller) that controls operations of the light-emitting element module 10 and the atom cell unit 20. Hereinafter, an overview of the frequency signal generation device 100 will be described.

The light-emitting element module 10 includes a Peltier element 11, a light-emitting element 12, and a temperature sensor 13. The light-emitting element 12 emits linearly polarized light LL that contains two fields of light with different frequencies. The temperature sensor 13 measures the temperature of the light-emitting element 12. The Peltier element 11 adjusts the temperature of the light-emitting element 12 (heats or cools the temperature of the light-emitting element 12).

The optical system unit 30 includes a light reduction filter 31, a lens 32, and a quarter wavelength plate 33. The light reduction filter 31 reduces the strength of the light LL emitted from the light-emitting element 12. The lens 32 adjusts a radiation angle of the light LL (for example, causes the light LL to become parallel light).

The quarter wavelength plate 33 converts the two fields of light with different frequencies contained in the light LL from linearly polarized light to circularly polarized light (right-handed circularly polarized light or left-handed circularly polarized light).

The atom cell unit 20 includes an atom cell 21, a light-receiving element 22, a heater 23, a temperature sensor 24, and a coil 25.

The atom cell 21 has optical transparency and alkali metal is received in the atom cell 21. The alkali metal atoms have energy levels of three level systems, two mutually different ground levels and an excited level. The light LL emitted from the light-emitting element 12 is incident on the atom cell 21 via the light reduction filter 31, the lens 32, and the quarter wavelength plate 33. The light-receiving element 22 receives the light LL passing through the atom cell 21 and detects the light LL.

The heater 23 heats the alkali metal atoms received in the atom cell 21 to place at least some of the alkali metal atoms in a gaseous state. The temperature sensor 24 measures the temperature of the atom cell 21. The coil 25 applies a magnetic field in a predetermined direction to the alkali metal atoms received in the atom cell 21 to perform Zeeman splitting on the energy levels of the alkali metal atoms. When a pair of pieces of circularly polarized light is radiated to the alkali metal atoms in the Zeeman splitting state of the alkali metal atoms, the number of alkali metal atoms at a desired energy level among the plurality of levels of the alkali metal atoms subjected to the Zeeman splitting can be caused to be relatively greater than the number of alkali metal atoms at the other energy levels. Therefore, the number of atoms manifesting a desired EIT phenomenon increases and a desired EIT signal thus increases. As a result, it is possible to improve oscillation characteristics of the frequency signal generation device 100.

The control unit 50 includes a temperature controller 51, a light source controller 52, a magnetic field controller 53, and a temperature controller 54. The temperature controller 51 controls conductivity to the heater 23 so that the inside of the atom cell 21 is at a desired temperature based on a detection result of the temperature sensor 24.

The magnetic field controller 53 controls conductivity to the coil 25 so that a magnetic field generated by the coil 25 is constant. The temperature controller 54 controls conductivity to the Peltier element 11 so that the temperature of the light-emitting element 12 is a desired temperature based on a detection result of the temperature sensor 13.

The light source controller 52 controls frequencies of two fields of light contained in the light LL emitted from the light-emitting element 12 so that an EIT phenomenon occurs based on a detection result of the light-receiving element 22. Here, when the two fields of light serve as a pair of resonance lights of a frequency difference equivalent to an energy difference between two ground levels of the alkali metal atoms received in the atom cell 21, the EIT phenomenon occurs. The light source controller 52 includes a voltage-controlled oscillator (not illustrated) that controls an oscillation frequency so that stabilization is realized in synchronization with control of the frequencies of the two kinds of light and outputs an output signal of the voltage-controlled oscillator (VCO) as an output signal (clock signal) of the frequency signal generation device 100.

The overview of the frequency signal generation device 100 has been described. Hereinafter, a more specific configuration of the frequency signal generation device 100 will be described with reference to FIGS. 2 and 3.

Figure 2:
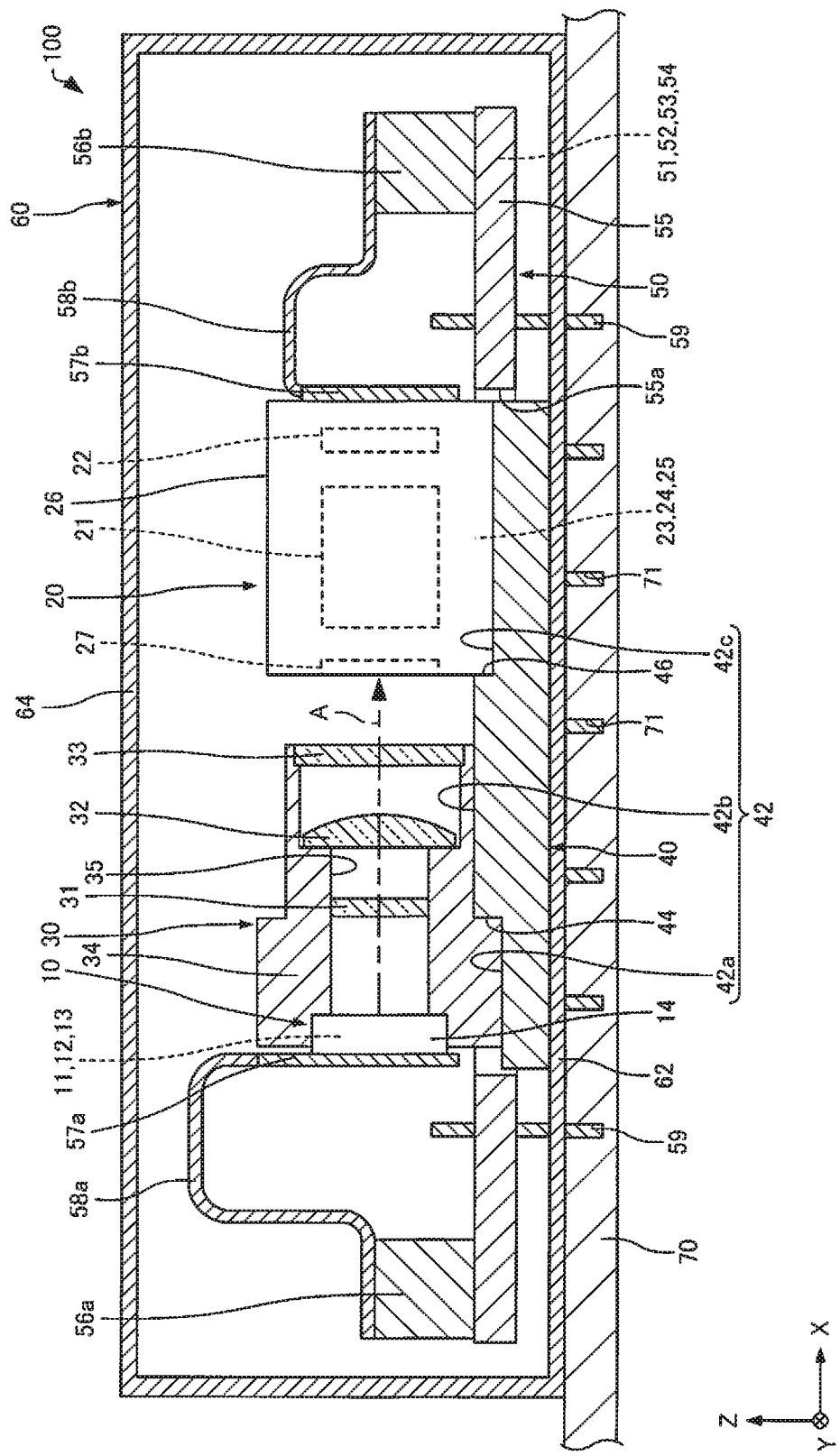
FIG. 2 is a sectional view schematically illustrating the frequency signal generation device according to the first embodiment.
Figure 3:
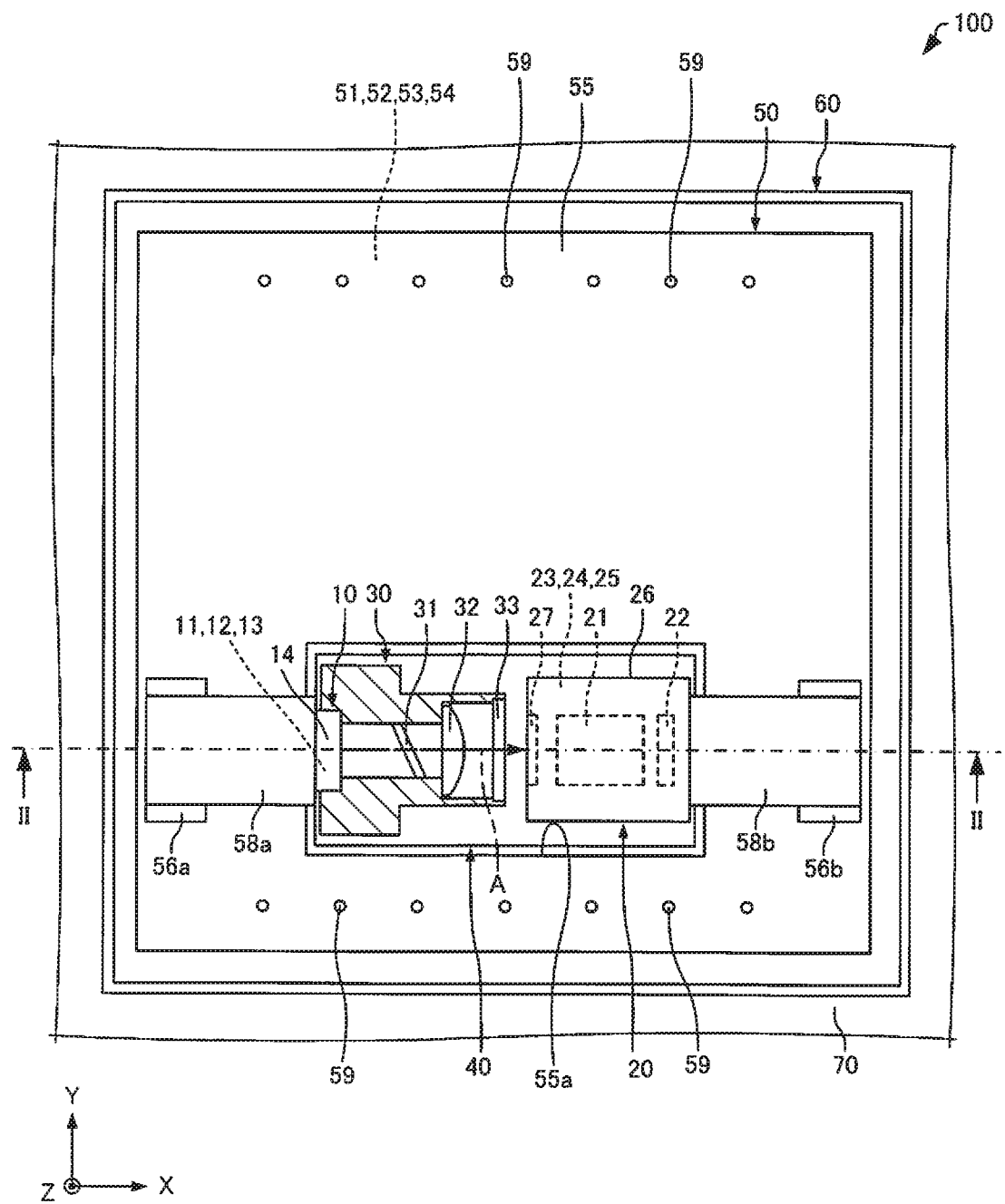
FIG. 3 is a plan view schematically illustrating the frequency signal generation device according to the first embodiment.

FIG. 2 is a sectional view schematically illustrating the frequency signal generation device 100. FIG. 3 is a plan view schematically illustrating the frequency signal generation device 100. FIG. 2 is a sectional view taken along the line II-II of FIG. 3. In FIGS. 2 and 3 and FIGS. 4 to 22 to be described below, the X, Y, and Z axes are illustrated as three axes which are orthogonal to each other. To facilitate the description, a lid 64 of a package 60 is not illustrated in FIG. 3. FIG. 3 is a sectional view illustrating a holder 34 of the optical system unit 30 cut on the XY plane.

The frequency signal generation device 100 includes the light-emitting element module 10, the atom cell unit 20, the optical system unit 30, a substrate 40 that supports the optical system unit 30, the control unit 50 that electrically connects the light-emitting element module 10 to the atom cell unit 20, a package (container) 60 that accommodates these units, and a disposition substrate 70.

Here, the Z axis is an axis perpendicular to a surface 42 of the substrate 40. A + direction is a direction oriented from the substrate 40 to disposed components. The X axis is an axis oriented from the light-emitting element module 10 to the light LL and the + direction is a direction in which the light travels. In other words, the X axis is an axis oriented in an arrangement direction of the light-emitting element module 10 and the atom cell unit 20 and the + direction is a direction oriented from the light-emitting element module 10 to the atom cell unit 20. The Y axis is an axis perpendicular to the X and Z axes.

The light-emitting element module 10 includes the Peltier element 11, the light-emitting element 12, the temperature sensor 13, and a package 14 that accommodates these units. The light-emitting element 12 is, for example, a vertical cavity surface emitting laser (VCSEL). The light-emitting element 12 is a light source that emits the light LL. Hereinafter, the light-emitting element 12 is also referred to as the light source 12.

The optical system unit 30 holds the light-emitting element module 10. The optical system unit 30 includes the light reduction filter 31, the lens 32, the quarter wavelength plate 33, and the holder 34 that holds these units.

A through hole 35 is formed in the holder 34. The through hole 35 is a passage region of the light LL. In the through hole 35, the light reduction filter 31, the lens 32, and the quarter wavelength plate 33 are disposed in this order. As illustrated in FIG. 3, the light reduction filter 31 is fixed to the holder 34 by an adhesive or the like (not illustrated) at an attitude at which the light reduction filter 31 is inclined to a surface which has an optical axis A of the light LL as a normal line. The lens 32 and the quarter wavelength plate 33 are fixed to the holder 34 by an adhesive or the like (not illustrated) at an attitude along with a surface that has the optical axis A as a normal line. The light-emitting element module 10 is fitted at the end of the through hole 35 on the side of the light reduction filter 31 (the left side in the −X axis direction) by a fitting member (not illustrated). The holder 34 is formed of, for example, a metal material such as aluminum and has heat dissipation. Thus, heat dissipation of the light-emitting element module 10 can be efficiently performed.

In the optical system unit 30, at least one of the light reduction filter 31 and the lens 32 can be omitted depending on strength, a radiation angle, or the like of the light LL from the light source 12.

The optical system unit 30 may include an optical element other than the light reduction filter 31, the lens 32, and the quarter wavelength plate 33. The disposition order of the light reduction filter 31, the lens 32, and the quarter wavelength plate 33 is not limited to the illustrated order and any order can be used.

The atom cell unit 20 includes the atom cell 21, the light-receiving element 22, the heater 23, the temperature sensor 24, the coil 25, and a package 26 that accommodates these units.

The atom cell 21 accommodates alkali metal such as gaseous rubidium, cesium, or sodium. The atom cell 21 may accommodate a rare gas such as argon or neon or an inactive gas such as nitrogen as a buffer gas along with the alkali metal atom, as necessary. The details of the atom cell 21 will be described later.

The light-receiving element 22 is disposed opposite to the light-emitting element module 10 with respect to the atom cell 21. The light-receiving element 22 is not particularly limited as long as the strength of the light LL (the pair of resonance lights) passing through the inside of the atom cell 21 can be measured. For example, a photodetector such as a solar cell or a photodiode can be exemplified.

Although not illustrated, for example, the heater 23 is disposed in the +Z axis direction of the atom cell 21 or is connected to the atom cell 21 via a heat conductive member such as metal. The heater 23 is not particularly limited as long as the atom cell 21 (more specifically, the alkali metal atoms accommodated in the atom cell 21) can be heated. For example, a Peltier element and various heaters including a heat resistor can be exemplified.

For example, the temperature sensor 24 is disposed near the atom cell 21 or the heater 23, although not illustrated. The temperature sensor 24 is not particularly limited as long as the temperature of the atom cell 21 or the heater 23 can be measured. For example, various known temperature sensors such as a thermistor or a thermoelectric couple can be exemplified.

Although not illustrated, the coil 25 is, for example, a solenoid type coil installed to wind around the outer circumference of the atom cell 21 or a pair of Helmholtz type coils facing each other via the atom cell 21. The coil 25 generates a magnetic field in a direction (a parallel direction) in the optical axis A of the light LL inside the atom cell 21.

Thus, the gap between different degenerated energy levels of the alkali metal atoms accommodated in the atom cell 21 spreads by the Zeeman splitting, so that a resolution can be improved and a line width of an EIT signal can be reduced. The magnetic field generated by the coil 25 may be any magnetic field between a direct-current magnetic field or an alternating-current magnetic field, or may be a magnetic field in which a direct-current magnetic field and an alternating-current magnetic field are superimposed.

Although not illustrated, the package 26 includes, for example, a base with a plate shape and a lid joined to the base. An airtight space in which the atom cell 21, the light-receiving element 22, the heater 23, the temperature sensor 24, and the coil 25 are accommodated is formed between the base and the lid. The base directly or indirectly supports the atom cell 21, the light-receiving element 22, the heater 23, the temperature sensor 24, and the coil 25. A plurality of terminals electrically connected to the light-receiving element 22, the heater 23, the temperature sensor 24, and the coil 25 are formed on the outer surface of the base. The lid has a bottomed cylindrical shape of which one end is opened and the opening is blocked by the base. A window 27 that has transparency of the light LL is formed at the other end (bottom) of the lid.

A constituent material of portions other than the base of the package 26 and the window of the lid is not particularly limited. For example, ceramics or metal can be exemplified. As a constituent material of the window 27, for example, a glass material can be exemplified. A method of joining the base to the lid is not particularly limited. For example, soldering, seam welding, or energy line welding (laser welding, electron beam welding, or the like) can be exemplified. Inside the package 26, a pressure lower than the atmospheric pressure is preferable. Thus, it is possible to control the temperature of the atom cell 21 simply and highly precisely. As a result, it is possible to improve characteristics of the frequency signal generation device 100.

The substrate 40 has the surface 42. The surface 42 is a surface of the substrate 40 oriented in the +Z axis direction. The surface 42 has, for example, regions 42a, 42b, and 42c. The regions 42a, 42b, and 42c are, for example, mutually parallel surfaces. When viewed in the Z axis direction, for example, the region 42b is located between the regions 42a and 42c.

In the illustrated example, the light source 12 is disposed in the region 42a of the surface 42 via the holder 34. The atom cell 21 is disposed in the region 42c of the surface 42 via the package 26. In this way, in the present specification, disposition of member A on surface B includes a case in which member A is directly disposed on surface B and a case in which member A is indirectly disposed on surface B via member C.

The region 42a of the surface 42 extends along the surface of the holder 34 in the −Z axis direction. A step 44 is formed between the regions 42a and 42b of the surface 42. The step 44 engages with a step of the surface of the holder 34 in the −Z axis direction to regulate movement of the holder 34 toward the atom cell unit 20 (in the +X axis direction).

Similarly, the region 42c of the surface 42 extends along the surface of the package 26 in the −Z axis direction. A step 46 is formed between the regions 42b and 42c of the surface 42. The step 46 engages with the surface of the package 26 in the −X axis direction to regulate movement of the package 26 toward the optical system unit 30 (in the −X axis direction).

In this way, a relative positional relation between the atom cell unit 20 and the optical system unit 30 can be defined in the substrate 40. Then, since the light-emitting element module 10 is fixed to the holder 34, a relative positional relation of the light-emitting element module 10 with respect to the atom cell unit 20 and the optical system unit 30 is also defined. Here, the package 26 and the holder 34 are fixed to the substrate 40 by fixing members such as screws (not illustrated). The substrate 40 is fixed to the package 60 by a fixing member such as a screw (not illustrated). The substrate 40 is formed of, for example, a metal material such as aluminum and has heat dissipation. Thus, it is possible to efficiently dissipate the heat of the light-emitting element module 10.

As illustrated in FIG. 3, the control unit 50 includes a circuit substrate 55, two connectors 56a and 56b installed on the circuit substrate 55, a rigid wiring substrate 57a connected to the light-emitting element module 10, a rigid wiring substrate 57b connected to the atom cell unit 20, a flexible wiring substrate 58a connecting the connector 56a to the rigid wiring substrate 57a, a flexible wiring substrate 58b connecting the connector 56b to the rigid wiring substrate 57b, and a plurality of lead pins 59 penetrating through the circuit substrate 55.

Integrated circuit (IC) chips (not illustrated) are installed on the circuit substrate 55. The IC chips function as the temperature controller 51, the light source controller 52, the magnetic field controller 53, and the temperature controller 54. A through hole 55a through which the substrate 40 is inserted is formed in the circuit substrate 55. The circuit substrate 55 is supported by the package 60 via the plurality of lead pins 59. The plurality of lead pins 59 penetrate through the outside and inside of the package 60 and are electrically connected to the circuit substrate 55.

The configuration in which the circuit substrate 55 and the light-emitting element module 10 are electrically connected and the configuration in which the circuit substrate 55 and the atom cell unit 20 are electrically connected are not limited to the illustrated connectors 56a and 56b, the rigid wiring substrates 57a and 57b, and the flexible wiring substrates 58a and 58b, but other known connectors and wirings may be used.

The package 60 accommodates the light-emitting element module 10, the atom cell unit 20, the optical system unit 30, the substrate 40, and the control unit 50. The package 60 includes a base 62 in which the substrate 40 is disposed and a lid 64 disposed opposite to the base 62. The package 60 is formed of, for example, a metal material such as Kovar and has a magnetic shielding property. Thus, it is possible to reduce an adverse influence of an external magnetic field on the characteristics of the frequency signal generation device 100. The inside of the package 60 may be depressurized or is at the atmospheric pressure.

Figure 4:
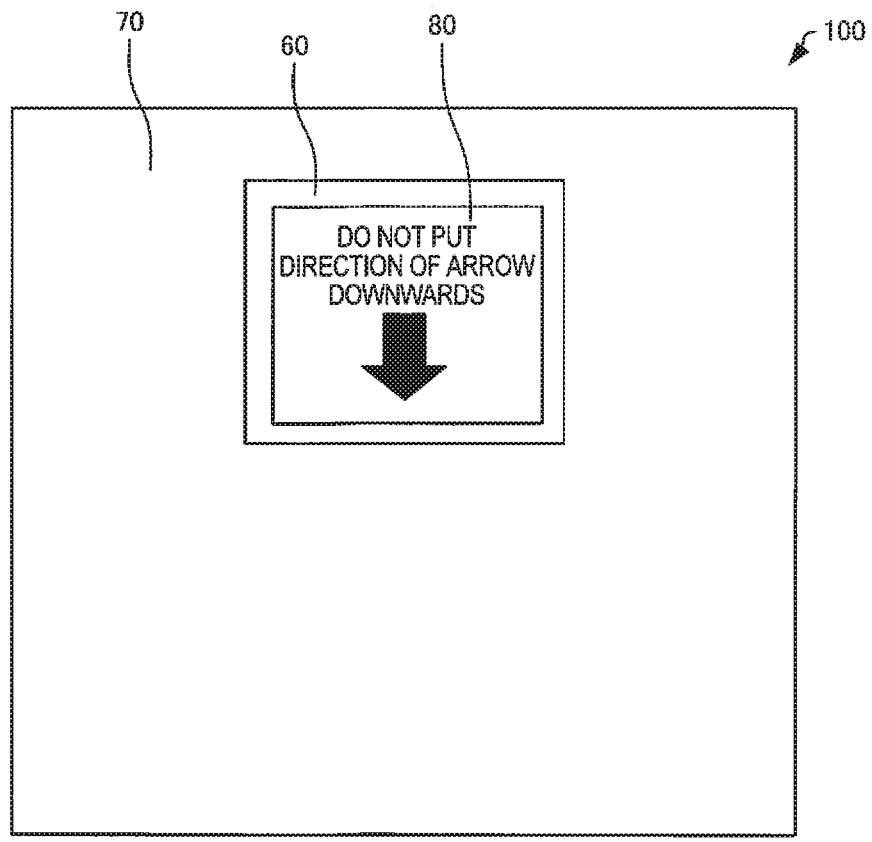
FIG. 4 is a plan view schematically illustrating the frequency signal generation device according to the first embodiment.
Figure 4:
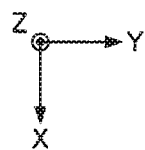
Figure 5:
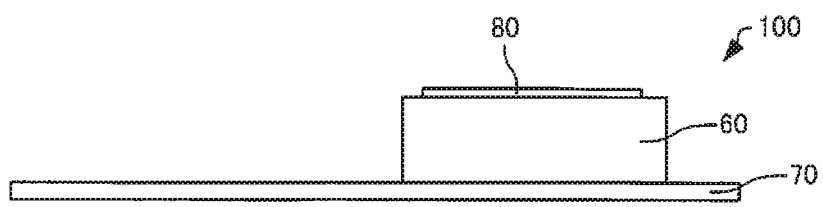
FIG. 5 is a side view schematically illustrating the frequency signal generation device according to the first embodiment.
Figure 5:
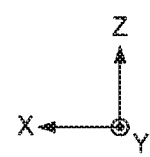

FIG. 4 is a plan view schematically illustrating the frequency signal generation device 100. FIG. 5 is a side view schematically illustrating the frequency signal generation device 100.

The disposition substrate 70 faces the substrate 40. The disposition substrate 70 has a surface facing the surface 42 of the substrate 40. As illustrated in FIGS. 2 to 5, the package 60 is disposed on the disposition substrate 70. In the example illustrated in FIG. 2, engagement portions 71 engaging with the lead pins 59 are installed in the disposition substrate 70. Thus, the package 60 is fixed to the disposition substrate 70. Wirings (not illustrated) connected to the lead pins 59 are installed on the disposition substrate 70. The wirings are configured to be connectable to external members (not illustrated). An electronic component (not illustrated) that transmits a signal from an external member to the control unit 50 may be installed on the disposition substrate 70. The disposition substrate 70 is, for example, a printed substrate.

The frequency signal generation device 100 includes a marker 80, as illustrated in FIGS. 4 and 5. In the illustrated example, the marker 80 is attached to the package 60. Specifically, the marker 80 is attached to a surface of the package 60 in the +Z axis direction. The marker 80 is a display member on which at least one of text or a symbol attached to the package 60 is displayed. In the illustrated example, text "Do not put direction of arrow downwards" and an arrow (sign) indicating the +X axis direction are displayed in the marker 80. The text and the symbol displayed in the marker 80 are involved in the disposition of the liquid alkali metal atoms accommodated in the atom cell 21 (of which the details will be described below). The form of the marker 80 is not particularly limited and may be a seal (a seal on which text or a symbol is displayed) or a plastic plate (a plastic plate on which text or a symbol is displayed) attached to the package 60 through an adhesive or the like.

The text of the marker 80 is not particularly limited. For example, "Not downwards", "Forbidden direction", or "Do not put this side put downwards" may be used. The symbol of the marker 80 is not particularly limited. For example, an arrow, an X-mark, or a forbidden symbol with a circle and a line segment obliquely crossing the diameter of the circle may be used. A color may be combined with at least one of text, a sign, and a structure.

In the marker 80, an arrow and text "Do not put direction of arrow lower than horizontal direction" may be displayed. An angle designated by the marker 80 can be set to an appropriate predetermined range by the structure of the like of the atom cell 21. The marker 80 is a display member on which, for example, a symbol "o" is displayed and may be attached to a predetermined surface of the package 60.

1.1.2 Atom Cell

Figure 6:
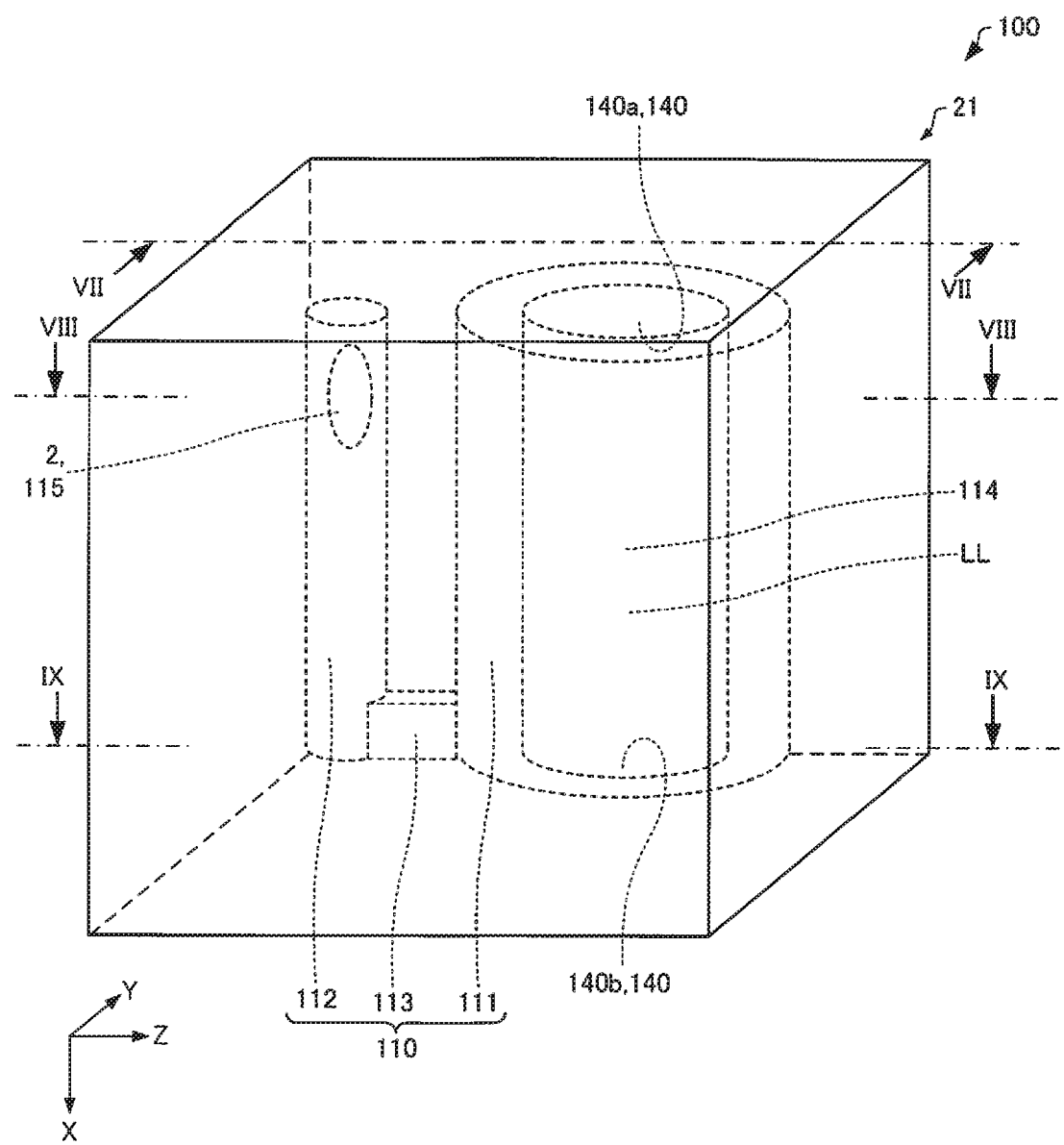
FIG. 6 is a perspective view schematically illustrating an atom cell of the frequency signal generation device according to the first embodiment.
Figure 7:
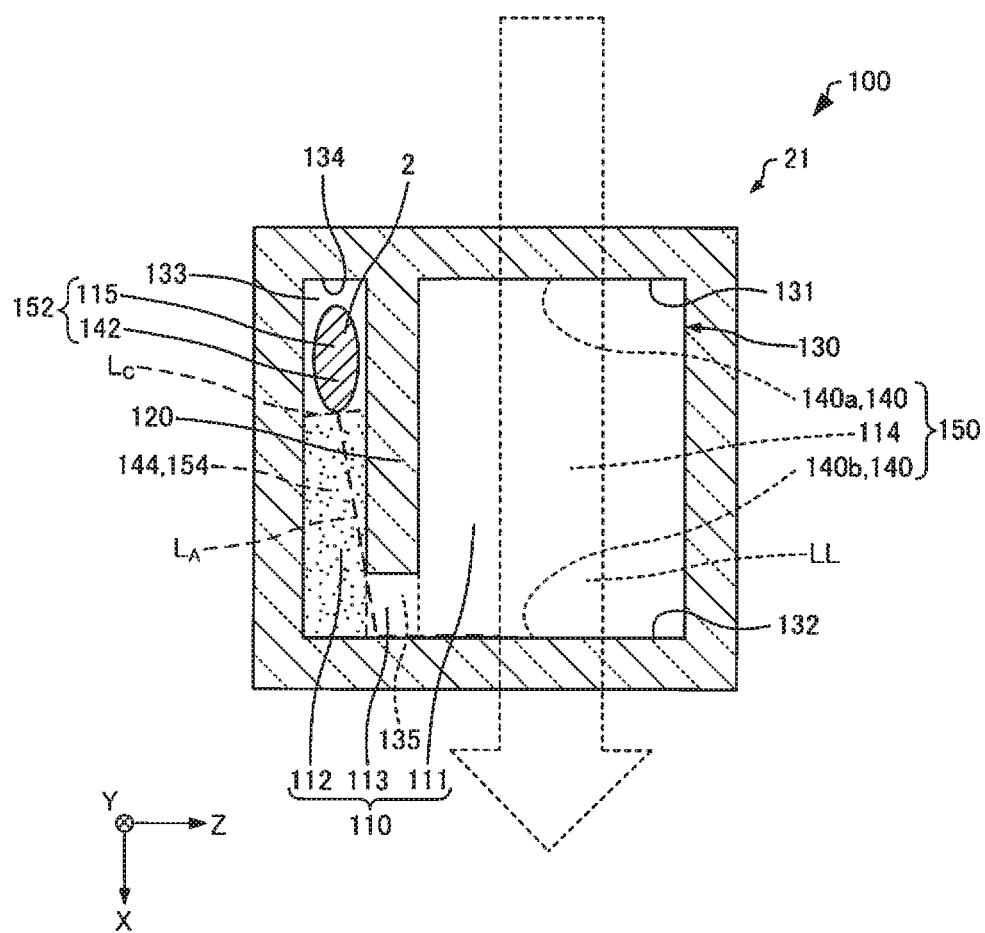
FIG. 7 is a sectional view schematically illustrating the atom cell of the frequency signal generation device according to the first embodiment.
Figure 8:
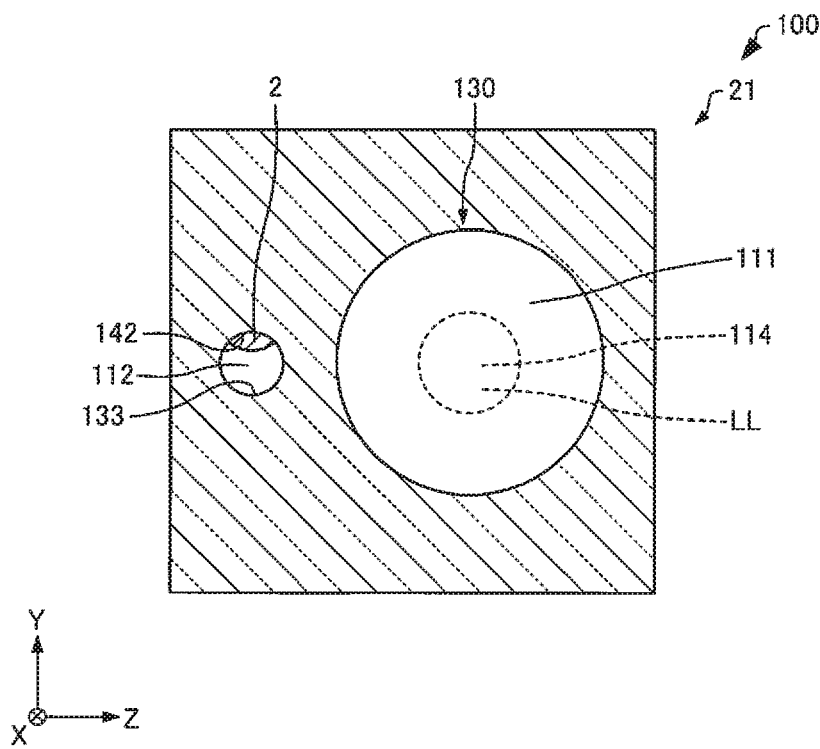
FIG. 8 is a sectional view schematically illustrating the atom cell of the frequency signal generation device according to the first embodiment.
Figure 9:
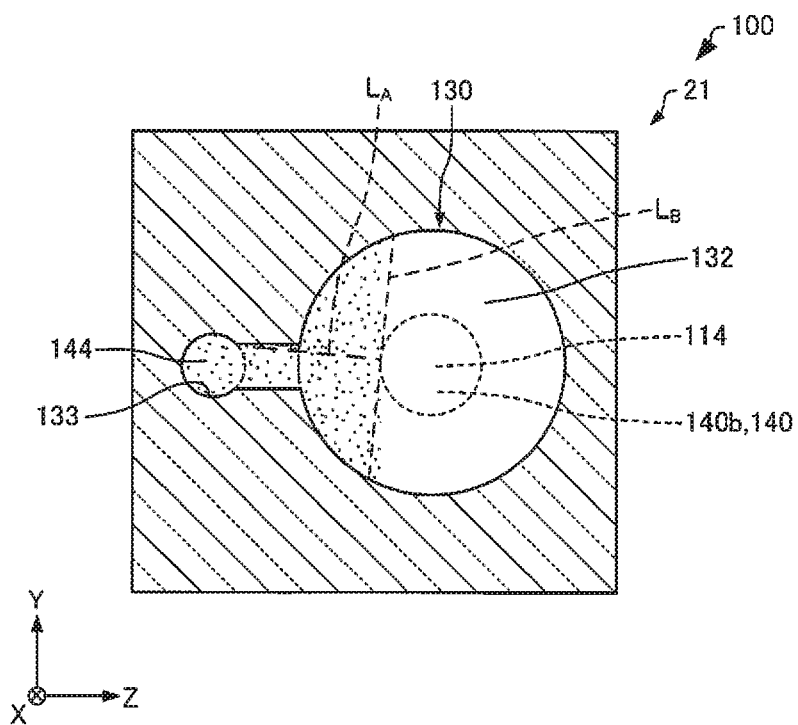
FIG. 9 is a sectional view schematically illustrating the atom cell of the frequency signal generation device according to the first embodiment.

Next, a detailed structure of the atom cell 21 will be described in detail. FIG. 6 is a perspective view schematically illustrating the atom cell 21. FIG. 7 is a sectional view taken along the line VII-VII of FIG. 6 schematically illustrating the atom cell 21. FIG. 8 is a sectional view taken along the line VIII-VIII of FIG. 6 schematically illustrating the atom cell 21. FIG. 9 is a sectional view taken along the line IX-IX of FIG. 6 schematically illustrating the atom cell 21.

The atom cell 21 includes a space 110 therein, as illustrated in FIGS. 6 to 9. In the space 110, there are the gaseous alkali metal atoms and the liquid alkali metal atoms 2. In the space 110, for example, there is a saturated vapor of the alkali metal atoms. The space 110 includes a cavity 111, a reservoir 112, and a communication hole 113. The atom cell 21 is formed, for example, by bonding a plurality of glass plates to each other.

The cavity 111 is, for example, a cylindrical space. The cavity 111 includes a first portion 114 through which the light LL emitted from the light source 12 passes. Hereinafter, the first portion 114 of the space is also referred to as a light passage portion 114. The first portion 114 of the space may also be referred to as a first space portion 114. In the illustrated example, the light passage portion 114 is cylindrical. The light LL travels in the X axis direction (along the X axis). In the light passage portion 114, there are the gaseous alkali metal atoms.

The reservoir 112 is separated from the cavity 111. The reservoir 112 is, for example, a cylindrical space. The width (for example, the diameter/size in the Z axis direction) of the reservoir 112 is less than the width (for example, the diameter/size in the Z axis direction) of the cavity 111. In the reservoir 112, there are the liquid alkali metal atoms 2. The reservoir 112 includes a second portion 115 in which there are the liquid alkali metal atoms 2. The second portion 115 of the space may also be referred to as a second space portion 115.

The communication hole 113 is a through hole fluid connecting the cavity 111 with the reservoir 112. The atom cell 21 includes a wall 120 between the cavity 111 and the reservoir 112.

The communication hole 113 is formed in the wall 120. In the illustrated example, the communication hole 113 has a substantially rectangular parallelepiped shape.

The atom cell 21 has an inner surface 130 defining the space 110. In the illustrated example, the inner surface 130 has a first surface 131, a second surface 132, a third surface 133, a fourth surface 134, and a fifth surface 135.

The first surface 131 is a surface that defines a wall of the cavity 111 in the −X axis direction. The second surface 132 is a surface that defines a wall of the cavity 111 in the +X axis direction. In the illustrated example, the second surface 132 further defines walls of the reservoir 112 and the communication hole 113 in the +X axis direction. The first surface 131 and the second surface 132 are surfaces parallel to the YZ plane. The third surface 133 is a surface that defines the reservoir 112. In the illustrated example, the third surface 133 is a surface that connects the fourth surface 134 and the second surface 132 defining walls of the reservoir 112 in the +X axis direction. The fifth surface 135 is a surface that defines the communication hole 113. In the illustrated example, the fifth surface 135 is a surface that defines a wall of the communication hole 113 in the +Y axis direction.

The inner surface 130 includes a first region 140 serving as an incident surface 140a or an exit surface 140b of the light LL emitted from the light source 12, a second region 142 in which there are the liquid alkali metal atoms 2, and a third region 144 that connects the first region 140 to the second region 142.

Two first regions 140 are formed. One of the first regions 140 is the incident surface 140a of the light LL and is a part of the first surface 131. The other of the first regions 140 is the exit surface 140b of the light LL and is a part of the second surface 132. The first region 140 can be said to be a portion through which the light LL of the first surface 131 passes and a portion through which the light LL of the second surface 132 passes.

The second region 142 is a part of the third surface 133. The second region 142 is a part of the third surface 133 that comes into contact with the liquid alkali metal atoms 2 when the surface 42 of the substrate 40 in which the atom cell 21 is disposed is oriented in a direction perpendicular to the gravity direction. In other words, the second region 142 is a part of the inner surface 130 of the atom cell 21 that comes into contact with the liquid alkali metal atoms 2 in the disposition of the atom cell 21 considered to be in a normal use state in design. In the embodiment, a disposition in which −Z axis direction is a direction in which gravity acts is the normal use state. The fact that the disposition in which −Z axis direction is the direction in which gravity acts is the normal use state is not limited to the embodiment. The same applies to modification examples and other embodiments.

The third region 144 is a region connecting the first region 140 to the second region 142. Here, "the third region 144 connecting the first region 140 to the second region 142" is a portion of the inner surface 130 located between the first region 140 and the second region 142. The third region 144 connecting the first region 140 to the second region 142 may be a portion of the inner surface 130 which reaches one of the first region 140 and the second region 142 to the other thereof along the inner surface 130. For example, from the viewpoint of description in a shortest path connecting the first region 140 to the second region 142, as illustrated in FIGS. 7 and 9, the third region 144 is a surface through which a line $L_A$ connecting the first region 140 to the second region 142 at the shortest distance passes and is a region between a straight line $L_B$ and a straight line $L_C$. Here, the straight line $L_B$ is a straight line perpendicular to the straight line $L_A$ passing an intersection between the straight line $L_A$ and the outer edge of the first region 140. The straight line $L_C$ is a straight line perpendicular to the straight line $L_A$ passing through an intersection between the straight line $L_A$ and the outer edge of the second region 142. In the illustrated example, the straight line $L_A$ is a line connecting the exit surface 140b to the second region 142.

In the illustrated example, the third region 144 includes a region of the second surface 132 in the −Z axis direction from the straight line $L_B$, a region of the third surface 133 in the +X axis direction from the straight line $L_C$, and the fifth surface 135.

As illustrated in FIG. 7, the atom cell 21 includes a first portion 150 including the first region 140 and the first space portion 114, a second portion 152 including the second region 142 and the second space portion 115, and a third portion 154 which is the third region 144.

1.1.3. Relation Between Marker and Atom Cell

The marker 80 indicates a direction in which the liquid alkali metal atoms 2 move toward the light passage portion 114 of the space 110 because of gravity when the surface of the substrate 40 is aligned with a gravitational direction.

Specifically, the marker 80 indicates a direction in which the liquid alkali metal atoms 2 in the second region 142 move to the third region 144 because of gravity when the surface 42 is oriented in the gravity direction. In the embodiment, the liquid alkali metal atoms 2 move along the inner surface 130 of the atom cell 21 because of gravity. That is, the marker 80 indicates at least a part of a path inside the atom cell when the liquid alkali metal atoms 2 become close to the light passage portion 114 because of gravity, in other words, when the liquid alkali metal atoms 2 move because of gravity in a direction in which an influence of the liquid alkali metal atoms 2 on the gaseous alkali metal atoms of the light passage portion 114 increases.

In the example illustrated in FIG. 7, when the +X axis direction is a direction in which gravity acts, the liquid alkali metal atoms 2 in the second region 142 move to the third region 144 because of gravity. Accordingly, the marker 80 indicates the +X axis direction, as illustrated in FIG. 4.

As described above, when the +X axis direction is the direction in which gravity acts, the liquid alkali metal atoms 2 provided on the third surface 133 move to the second surface 132 because of gravity. However, the liquid alkali metal atoms 2 that have moved to the second surface 132 do not move to the exit surface 140b depending on gravity. However, since the alkali metal atoms gasify and diffuse from the liquid alkali metal atoms 2 which have moved to the second surface 132, the alkali metal atoms have an influence on the light LL in some cases.

Accordingly, it is not preferable that the liquid alkali metal atoms 2 move to the third region 144 and reach the second surface 132.

The frequency signal generation device 100 has the following characteristics.

The frequency signal generation device 100 includes the marker 80 indicating the direction in which the liquid alkali metal atoms 2 move to the third region 144 because of gravity when the surface 42 of the substrate 40 is oriented in the gravity direction. Therefore, the user can recognize the direction in which the liquid alkali metal atoms 2 move because of gravity. Accordingly, in the frequency signal generation device 100, the marker 80 assists the user so that the user can recognize the direction of the disposition in which the liquid alkali metal atoms 2 rarely move into (or toward) the light passage portion 114 because of gravity. As a result, in the frequency signal generation device 100, it is possible to prevent an unexpected variation in the frequency in the atomic oscillator.

In the frequency signal generation device 100, the marker 80 is a display member on which at least one of text and a symbol attached to the package 60 is displayed. Therefore, in the frequency signal generation device 100, for example, by merely attaching the marker 80 formed of a seal to the package 60, it is possible to easily notify the user of a forbidden direction (a direction in which the liquid alkali metal atoms 2 move to the third region 116 because of gravity when the surface 42 is oriented in the gravity direction).

In the frequency signal generation device 100, the atom cell 21 includes the cavity 111 through which the light LL emitted from the light source 12 passes and the reservoir 112 in which there are the liquid alkali metal atoms 2. Therefore, in the frequency signal generation device 100, the liquid alkali metal atoms can rarely have an influence on an energy state of the gaseous alkali metal atoms 2 in the cavity 111 compared to the case in which there is no reservoir 112. Accordingly, it is possible to reduce the influence of the liquid alkali metal atoms 2 on the frequency of the frequency signal generation device 100.

In the frequency signal generation device 100, the atom cell 21 includes the wall 120 between the cavity 111 and the reservoir 112. The communication hole 113 connecting the cavity 111 to the reservoir 112 is formed in the wall 120. Therefore, in the frequency signal generation device 100, it is possible to prevent the liquid alkali metal atoms 2 in the reservoir 112 from having an influence on the gaseous alkali metal atoms in the cavity 111. In addition, it is possible to cause the cavity 111 to enter a saturated vapor pressure of the alkali metal atoms via the communication hole 113.

Figure 10:
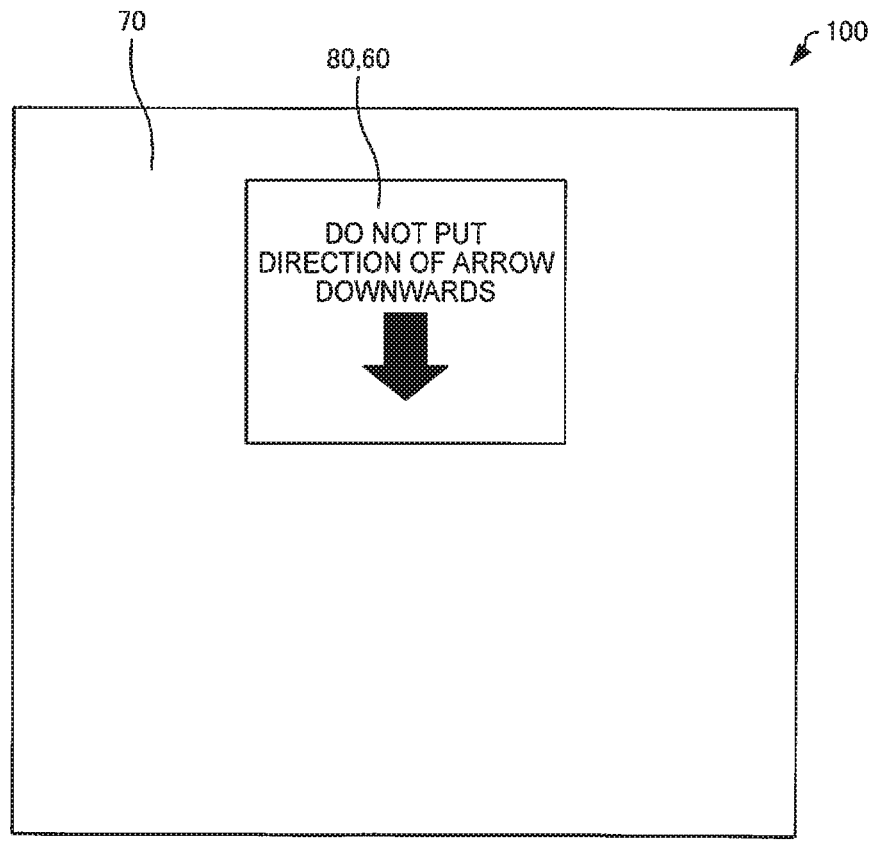
FIG. 10 is a plan view schematically illustrating the frequency signal generation device according to the first embodiment.
Figure 10:
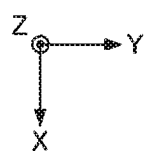

As illustrated in FIG. 10, at least one of text or a symbol may be directly attached to the package 60. In this case, the package 60 also serves as the marker 80. The marker 80 may be a structure installed to the package 60. For example, an uneven structure may be formed in a part of the package or a member with an uneven structure may be attached as a display member to the package 60.

Figure 11:
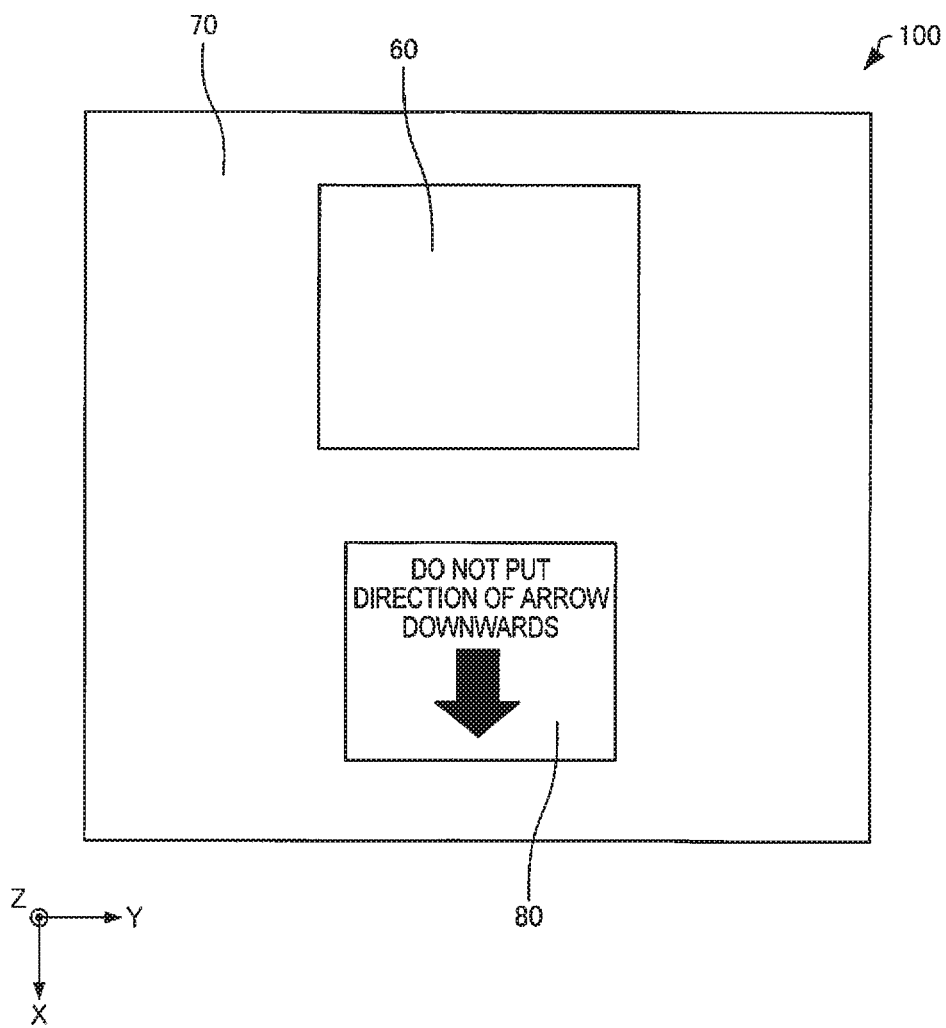
FIG. 11 is a plan view schematically illustrating the frequency signal generation device according to the first embodiment.

As illustrated in FIG. 11, the marker 80 may not be on the package 60, but may be a display member attached to the disposition substrate 70. The marker 80 may be attached to a surface of the disposition substrate 70 on which the package 60 is disposed, or attached to a surface opposite to the surface on which the package 60 is disposed. A specific example of the marker 80 attached to the disposition substrate 70 is the same as the marker 80 attached to the package 60. The markers 80 may be attached to a plurality of spots such as both the package 60 and the disposition substrate 70.

For the marker 80, a forbidden direction may be indirectly indicated by indicating the opposite direction to the direction (the forbidden direction) in which the liquid alkali metal atoms 2 move toward the light passage portion 114 of the space 110 because of gravity when the surface 42 of the substrate 40 is oriented in the gravity direction. For example, the arrow of the marker 80 may indicate the −X axis direction and text "Do not put direction of arrow upwards" may be described on the marker 80. When the marker 80 directly indicates the forbidden direction, the user easily recognizes inappropriate disposition. When the marker 80 indicates a direction which is not the forbidden direction, appropriate disposition is realized by disposing according to the indicated direction. Therefore, the user can more easily understand the appropriate disposition. The direction in which the marker 80 may be disposed is not always one direction. For example, in the embodiment, the +X axis direction, the +Y axis direction, or the −Y axis direction may be the gravity direction. Therefore, for example, two or more of these directions such as "Put direction of any arrow upwards" may be indicated by the marker 80. On the marker 80, text of "Put direction of arrow higher than horizontal direction" and an arrow may be displayed. An angle designated by the marker 80 can be set in an appropriate predetermined range according to the structure or the like of the atom cell 21.

Figure 12:
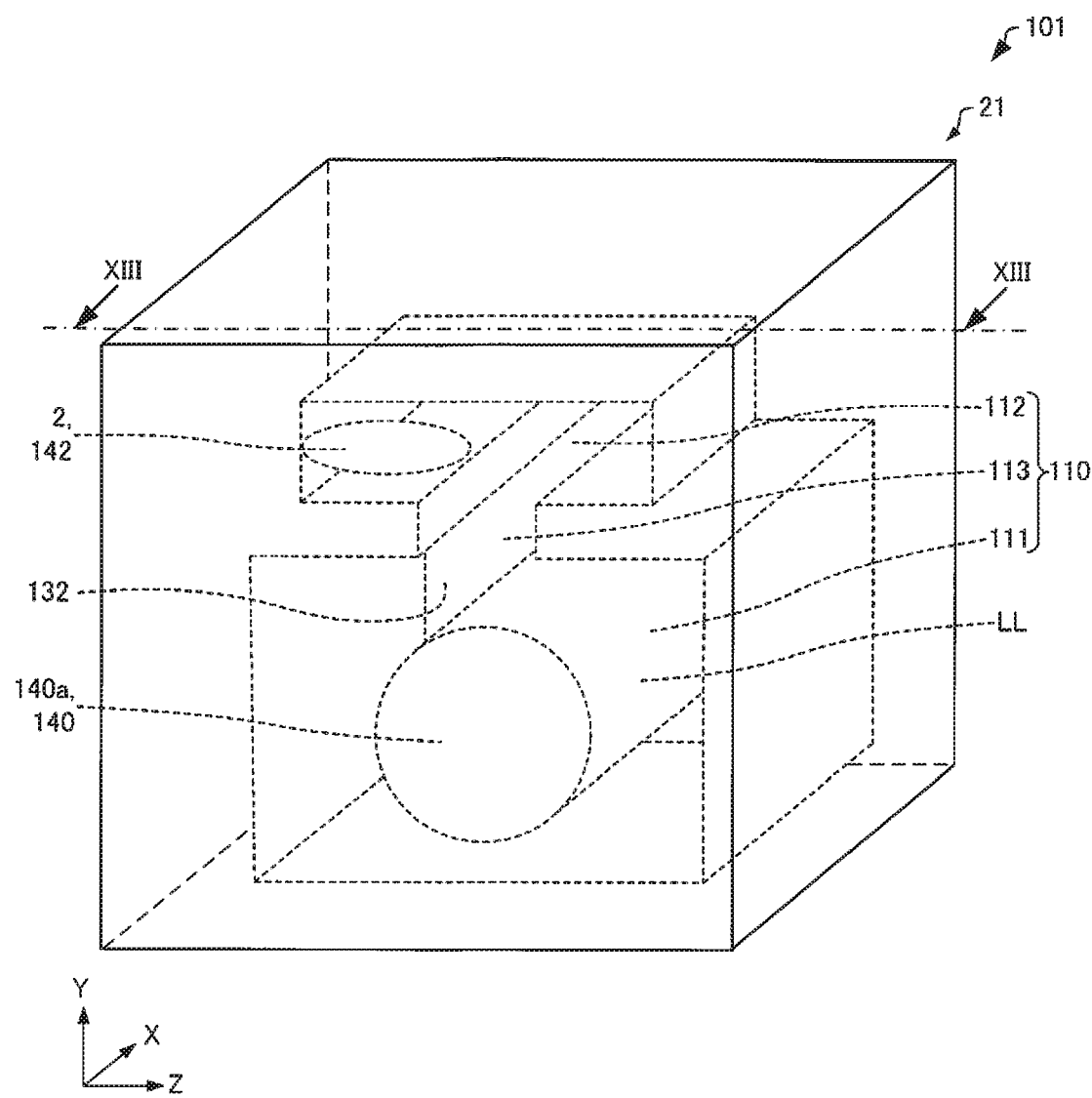
FIG. 12 is a perspective view schematically illustrating an atom cell of a frequency signal generation device according to a first modification example of the first embodiment.
Figure 13:
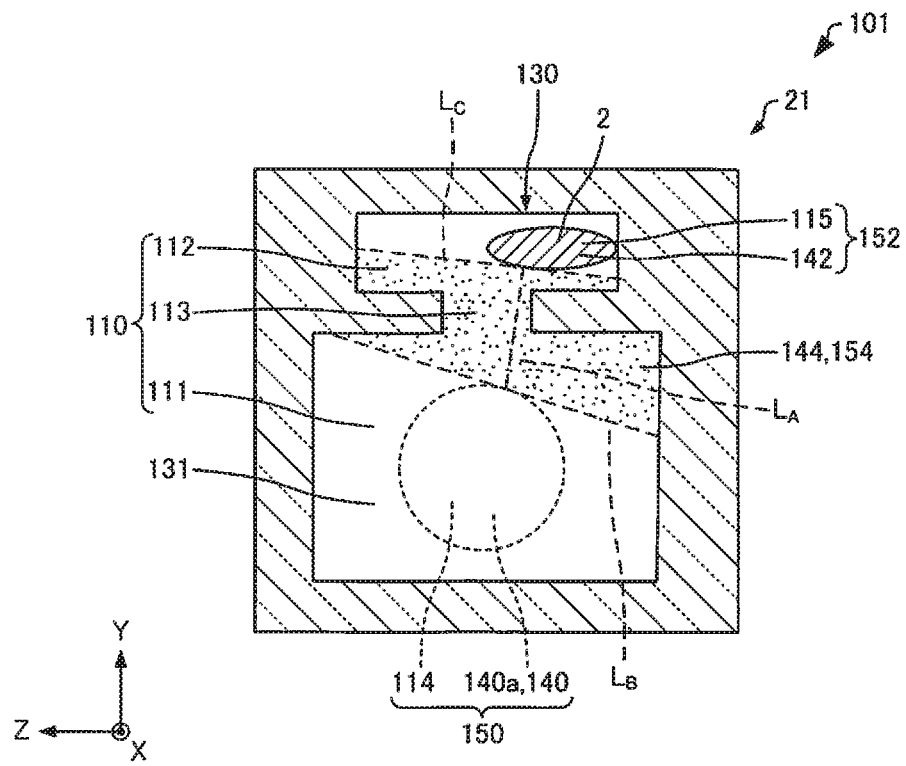
FIG. 13 is a sectional view schematically illustrating the atom cell of the frequency signal generation device according to the first modification example of the first embodiment.

1.2. Modification Examples of Frequency Signal Generation Device 1.2.1. First Modification Example Next, a frequency signal generation device 101 according to a first modification example of the first embodiment will be described with reference to the drawings. FIG. 12 is a perspective view schematically illustrating the atom cell 21 of the frequency signal generation device 101 according to the first modification example of the first embodiment. FIG. 13 is a sectional view taken along the line XIII-XIII of FIG. 12 schematically illustrating the atom cell 21 of the frequency signal generation device 101 according to the first modification example of the first embodiment.

Hereinafter, different points between the frequency signal generation device 101 according to the first modification example of the first embodiment and the example of the above-described frequency signal generation device 100 will be described and the same points therebetween will be omitted. This is true for frequency signal generation devices according to second, third, and fourth modification examples of the first embodiment to be described below.

In the atom cell 21 of the above-described frequency signal generation device 100, as illustrated in FIGS. 6 and 7, the first region 140 and the second region 142 are formed on the different surfaces of the inner surface 130 of the atom cell 21. However, in the atom cell 21 of the frequency signal generation device 101, as illustrated in FIGS. 12 and 13, an incident surface 140a of the first region 140 and the second region 142 are formed on the same surface (the first surface 131).

In the atom cell 21 of the frequency signal generation device 101, the cavity 111 and the reservoir 112 have a rectangular parallelepiped shape (including a cube). The communication hole 113 is formed in the wall 120 and is a slit-shaped slot extending in a travel direction of the light LL. The communication hole 113 is formed on the side of the light passage portion 114 in the +Y axis direction.

The inner surface 130 of the atom cell 21 includes a first surface 131 and a second surface 132. The first surface 131 defines walls of the cavity 111, the reservoir 112, and the communication hole 113 in the −X axis direction. The second surface 132 defines walls of the cavity 111, the reservoir 112, and the communication hole 113 in the +X axis direction. That is, the lengths of the cavity 111, the reservoir 112, and the communication hole 113 in the X axis direction are the same.

The incident surface 140a which is the first region 140 is a part of the first surface 131. The second region 142 is a part of the first surface 131. That is, the incident surface 140a and the second region 142 in which there are the liquid alkali metal atoms 2 are located on the same plane. The exit surface 140b which is the first region 140 is a part of the second surface 132.

As illustrated in FIG. 13, the third region 144 is formed by a region between straight lines $L_B$ and $L_C$ of the first surface 131.

In the example illustrated in FIG. 13, when the −Y axis direction is the direction in which gravity acts, the liquid alkali metal atoms 2 in the second region 142 move to the third region 144 because of gravity. Accordingly, the marker 80 indicates the −Y axis direction. Here, the fact that "the liquid alkali metal atoms 2 in the second region 142 move to the third region 144 because of gravity" means that some or all of the liquid alkali metal atoms 2 in the second region 142 move to the third region 144 because of gravity. Here, in the example illustrated in FIG. 13, when the +Z axis direction is completely identical to the direction in which gravity acts, the liquid alkali metal atoms 2 remains in the reservoir 112 though the liquid alkali metal atoms 2 move to the third region 144. Therefore, the liquid alkali metal atoms 2 do not move to the first region 140. In this case, the marker 80 preferably indicates a direction in which the liquid alkali metal atoms 2 become close to the first region 140 via the third region 144, that is, the −Y axis direction and may not indicate the +Z axis direction.

1.2.2. Second Modification Example

Figure 14:
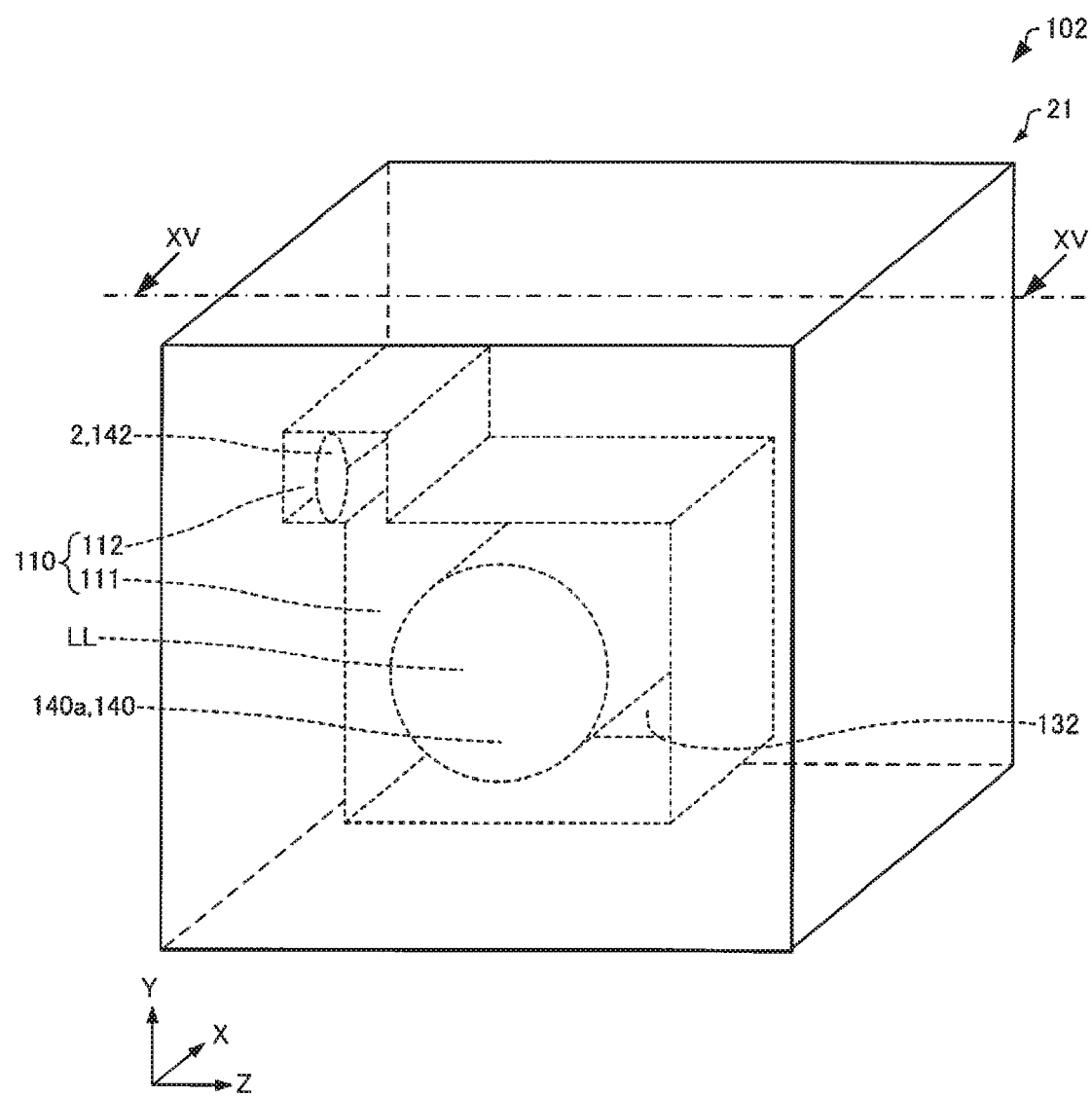
FIG. 14 is a perspective view schematically illustrating an atom cell of a frequency signal generation device according to a second modification example of the first embodiment.
Figure 15:
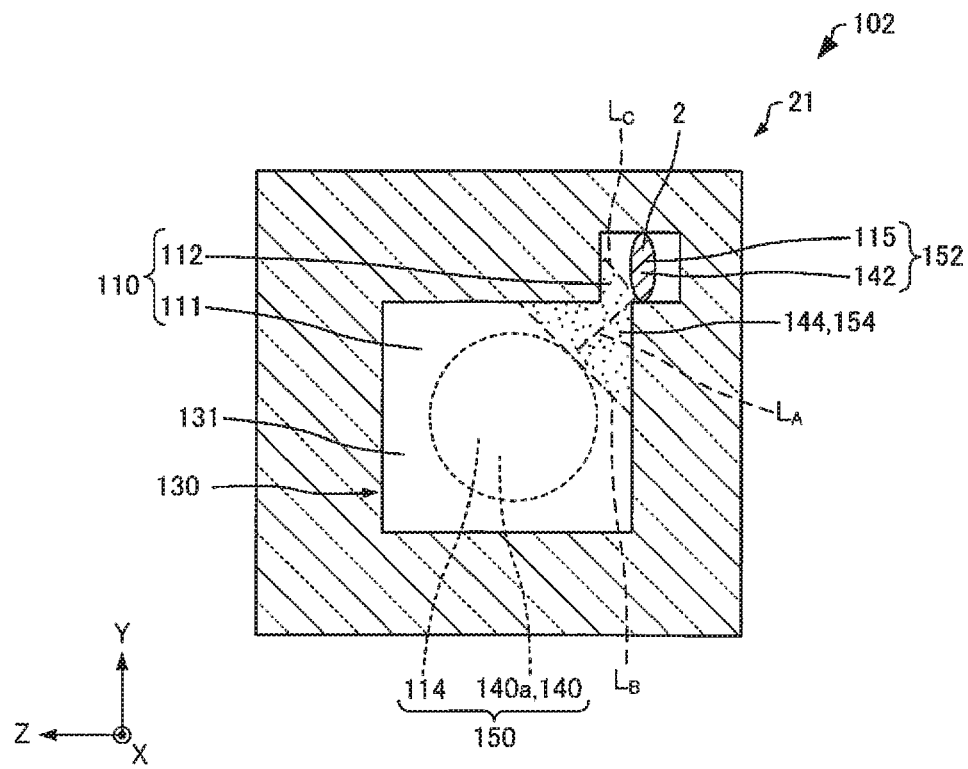
FIG. 15 is a sectional view schematically illustrating the atom cell of the frequency signal generation device according to the second modification example of the first embodiment.

Next, a frequency signal generation device 102 according to a second modification example of the first embodiment will be described with reference to the drawings. FIG. 14 is a perspective view schematically illustrating the atom cell 21 of the frequency signal generation device 102 according to the second modification example of the first embodiment. FIG. 15 is a sectional view taken along the line XV-XV of FIG. 14 schematically illustrating the atom cell 21 of the frequency signal generation device 102 according to the second modification example of the first embodiment.

In the atom cell 21 of the above-described frequency signal generation device 100, as illustrated in FIGS. 6 and 7, the first region 140 and the second region 142 are formed on the different surfaces of the inner surface 130 of the atom cell 21. However, in the atom cell 21 of the frequency signal generation device 102, as illustrated in FIGS. 14 and 15, an incident surface 140a of the first region 140 and the second region 142 are formed on the same surface (the first surface 131).

In the atom cell 21 of the frequency signal generation device 102, the cavity 111 and the reservoir 112 have a rectangular parallelepiped shape (including a cube). The cavity 111 and the reservoir 112 are continuous. In the illustrated example, the reservoir 112 is located in the corner of the cavity 111.

The inner surface 130 of the atom cell 21 includes a first surface 131 and a second surface 132. The first surface 131 defines walls of the cavity 111 and the reservoir 112 in the −X axis direction. The second surface 132 defines walls of the cavity 111 and the reservoir 112 in the +X axis direction.

That is, the lengths of the cavity 111 and the reservoir 112 in the X axis direction are the same.

The incident surface 140a which is the first region 140 is a part of the first surface 131. The second region 142 is a part of the first surface 131. That is, the incident surface 140a and the second region 142 in which there are the liquid alkali metal atoms 2 are located on the same plane. The exit surface 140b which is the first region 140 is a part of the second surface 132.

As illustrated in FIG. 15, the third region 144 is formed by a region between straight lines $L_B$ and $L_C$ of the first surface 131.

In the example illustrated in FIG. 15, when the −Y axis direction is the direction in which gravity acts, the liquid alkali metal atoms 2 in the second region 142 move to the third region 144 because of gravity. Accordingly, the marker 80 indicates the −Y axis direction. Further, in the example illustrated in FIG. 15, even when the +Z axis direction is the direction in which gravity acts, the liquid alkali metal atoms 2 in the second region 142 move to the third region 144 because of gravity. Accordingly, the marker 80 may indicate the +Z axis direction in addition to the −Y axis direction. When there is a direction in which the liquid alkali metal atoms 2 relatively easily move to the third region 144 because of the shape or the like the atom cell 21 between a plurality of directions in which the liquid alkali metal atoms 2 move to the third region 144 because of gravity, in this example, between the −Y axis direction and the +Z axis direction, the marker 80 may indicate only this direction or may emphasize this direction. Further, the marker 80 may indicate a direction oriented along the straight line $L_A$ and oriented from the second region 142 to the incident surface 140a. For example, the marker 80 may indicate a range such as a range from the −Y axis direction to the +Z axis direction. Even in these cases, the marker 80 may indicate a direction in which the liquid alkali metal atoms 2 rarely move instead of the direction in which the liquid alkali metal atoms 2 move or may indicate both of the direction in which the liquid alkali metal atoms 2 move and the direction in which the liquid alkali metal atoms 2 rarely move.

1.2.3. Third Modification Example

Figure 16:
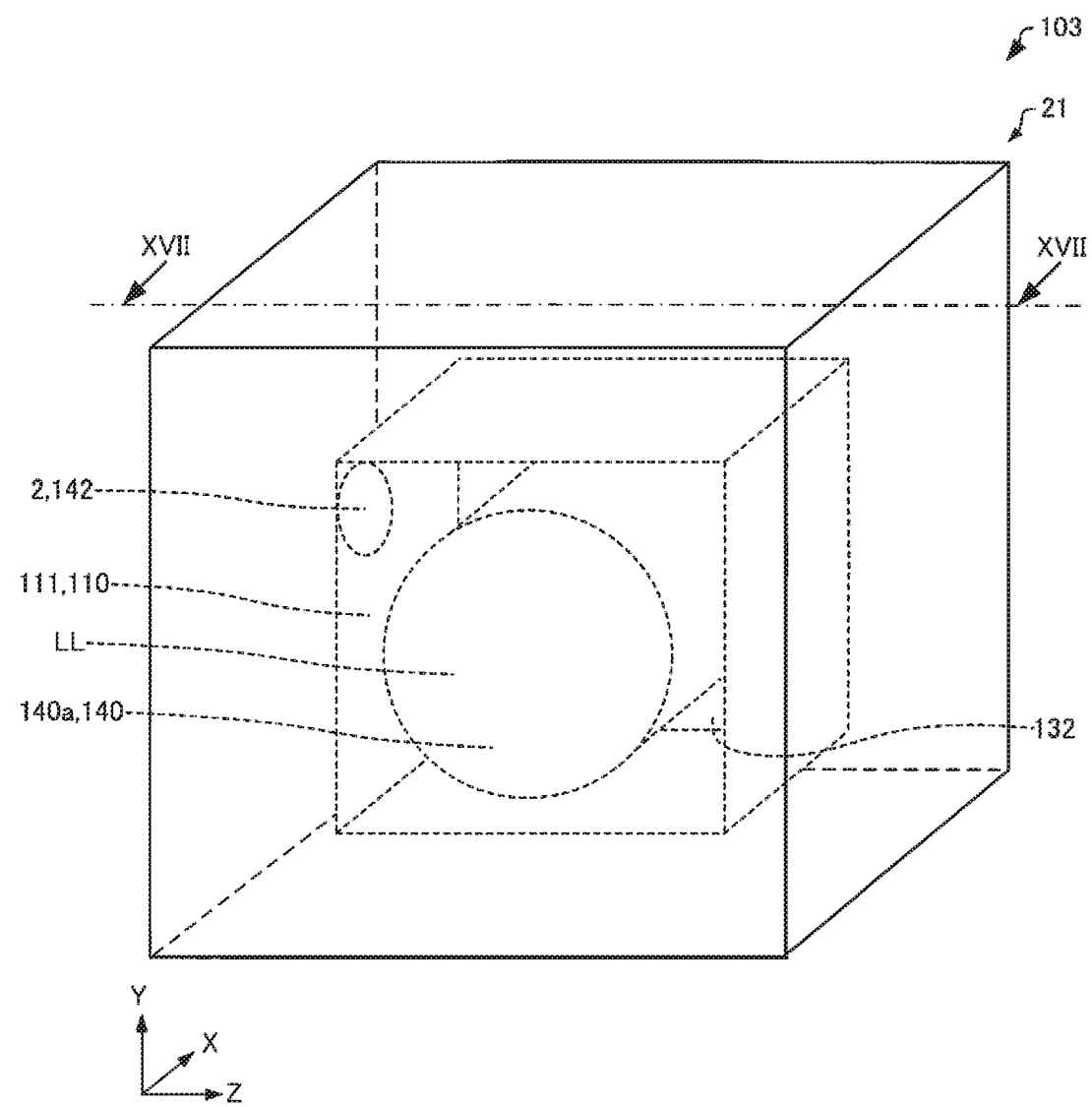
FIG. 16 is a perspective view schematically illustrating an atom cell of a frequency signal generation device according to a third modification example of the first embodiment.
Figure 17:
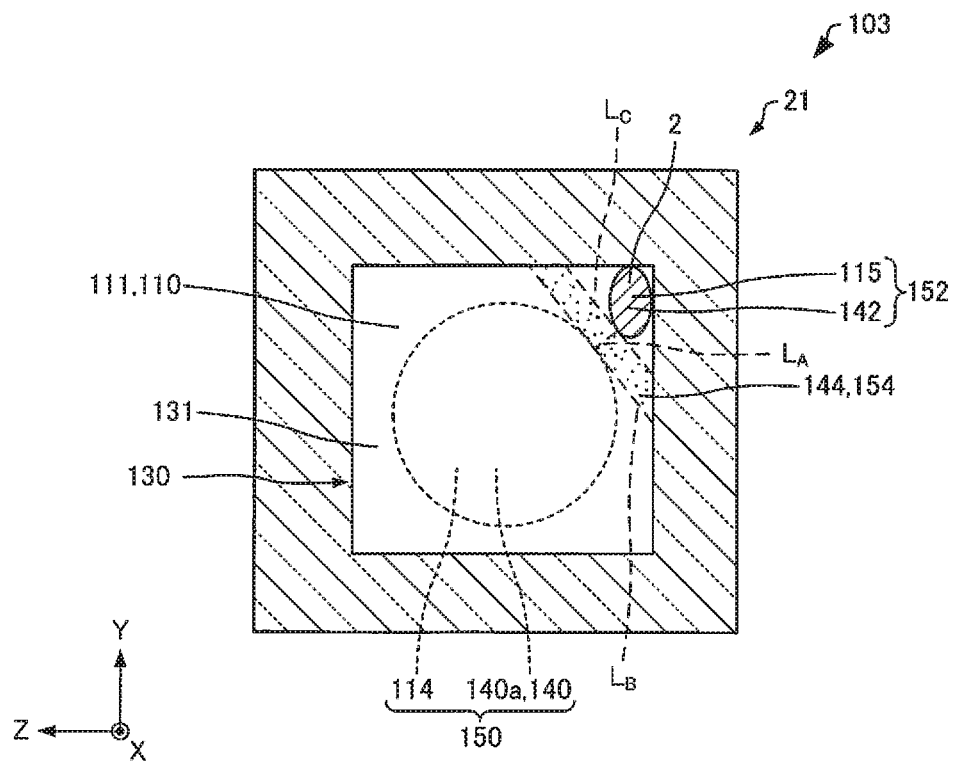
FIG. 17 is a sectional view schematically illustrating the atom cell of the frequency signal generation device according to the third modification example of the first embodiment.

Next, a frequency signal generation device 103 according to a third modification example of the first embodiment will be described with reference to the drawings. FIG. 16 is a perspective view schematically illustrating the atom cell 21 of the frequency signal generation device 103 according to the third modification example of the first embodiment. FIG. 17 is a sectional view taken along the line XVII-XVII of FIG. 16 schematically illustrating the atom cell 21 of the frequency signal generation device 103 according to the third modification example of the first embodiment.

In the atom cell 21 of the above-described frequency signal generation device 100, as illustrated in FIGS. 6 and 7, the space 110 includes the cavity 111, the reservoir 112, and the communication hole 113. However, in the atom cell 21 of the frequency signal generation device 103, as illustrated in FIGS. 16 and 17, a space 110 does not include the reservoir 112 and the communication hole 113.

The space 110 includes the cavity 111.

In the illustrated example, the shapes of the cavity 111 and the reservoir 112 have a rectangular parallelepiped (including a cube).

The inner surface 130 of the atom cell 21 includes a first surface 131 and a second surface 132. The first surface 131 defines walls of the cavity 111 in the −X axis direction. The second surface 132 defines walls of the cavity 111 in the +X axis direction.

The incident surface 140a which is the first region 140 is a part of the first surface 131. The second region 142 is a part of the first surface 131. That is, the incident surface 140a and the second region 142 in which there are the liquid alkali metal atoms 2 are located on the same plane. In the illustrated example, the liquid alkali metal atoms 2 are located in a corner along the first surface 131. The exit surface 140b which is the first region 140 is a part of the second surface 132.

As illustrated in FIG. 17, the third region 144 is formed by a region between straight lines $L_B$ and $L_C$ of the first surface 131.

In the example illustrated in FIG. 17, when the −Y axis direction is the direction in which gravity acts, the liquid alkali metal atoms 2 in the second region 142 move to the third region 144 because of gravity. Accordingly, the marker 80 indicates the −Y axis direction. Further, in the example illustrated in FIG. 17, when the +Z axis direction is the direction in which gravity acts, the liquid alkali metal atoms 2 in the second region 142 move to the third region 144 because of gravity. Accordingly, the marker 80 may indicate the +Z axis direction in addition to the −Y axis direction. Further, the marker 80 may indicate a direction oriented along the straight line $L_A$ and oriented from the second region 142 to the incident surface 140a.

1.2.4. Fourth Modification Example

Figure 18:
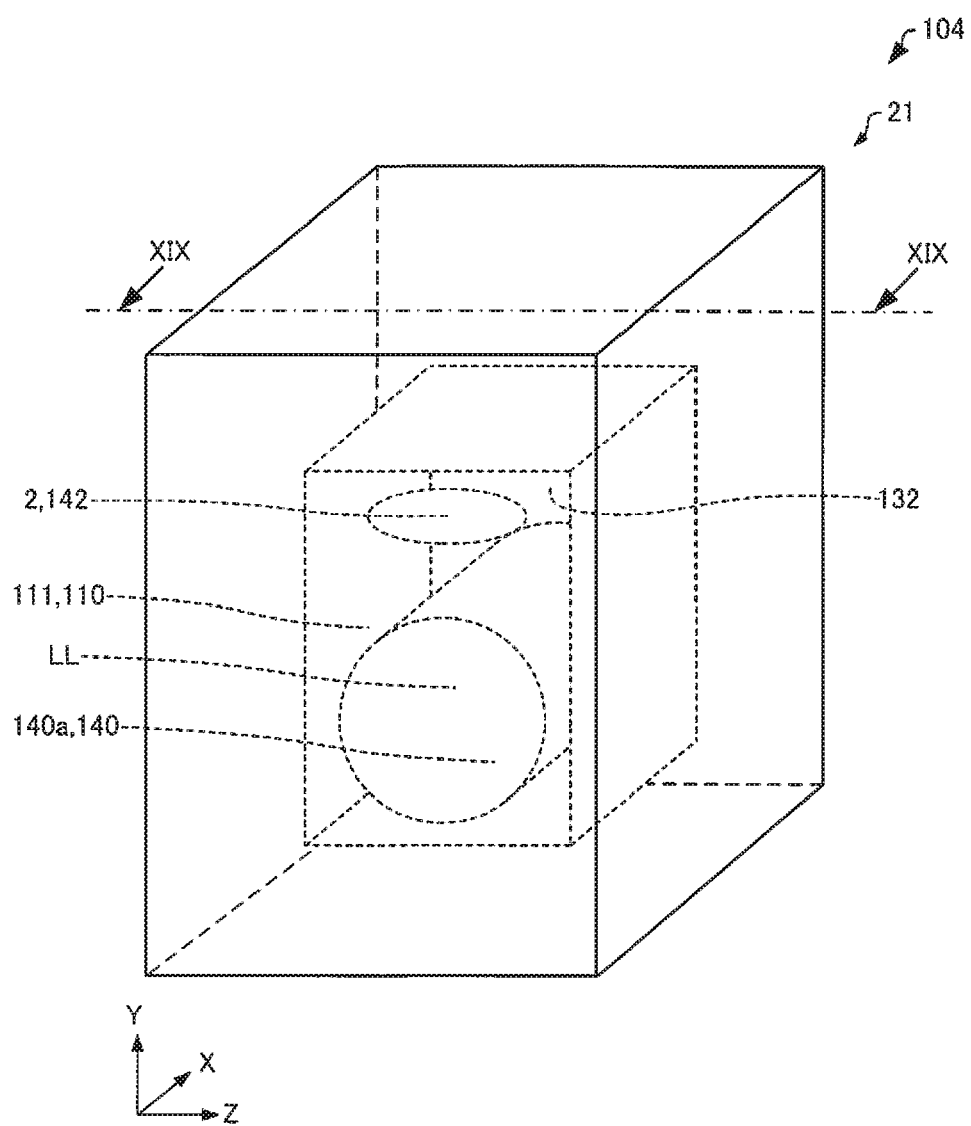
FIG. 18 is a perspective view schematically illustrating an atom cell of a frequency signal generation device according to a fourth modification example of the first embodiment.
Figure 19:
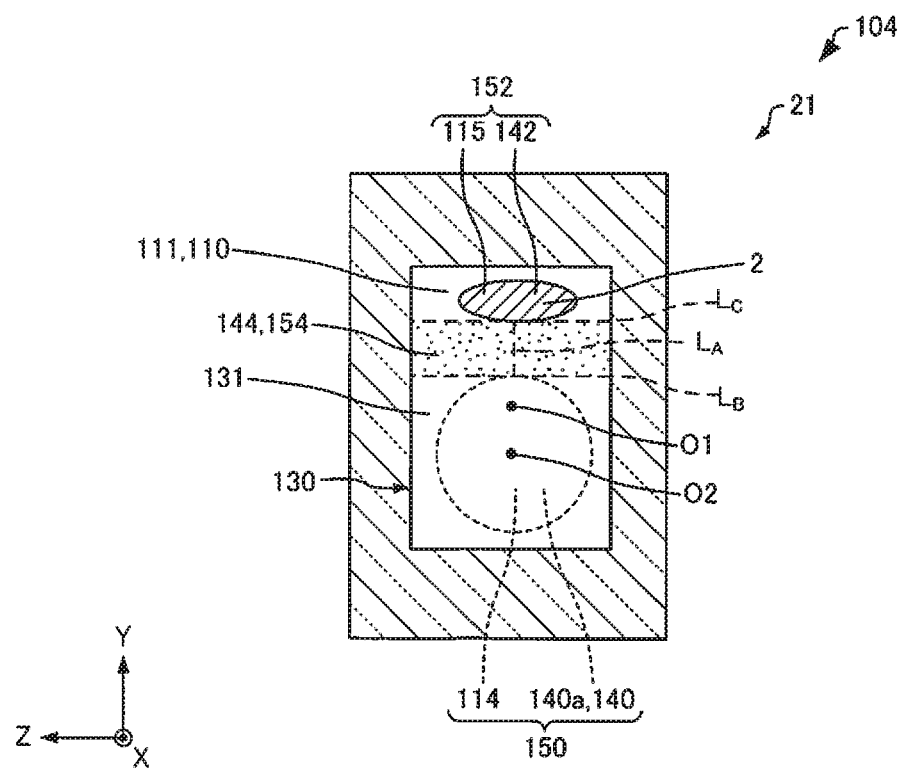
FIG. 19 is a sectional view schematically illustrating the atom cell of the frequency signal generation device according to the fourth modification example of the first embodiment.

Next, a frequency signal generation device 104 according to a fourth modification example of the first embodiment will be described with reference to the drawings. FIG. 18 is a perspective view schematically illustrating the atom cell 21 of the frequency signal generation device 104 according to the fourth modification example of the first embodiment. FIG. 19 is a sectional view taken along the line XIX-XIX of FIG. 18 schematically illustrating the atom cell 21 of the frequency signal generation device 104 according to the fourth modification example of the first embodiment.

In the atom cell 21 of the above-described frequency signal generation device 100, as illustrated in FIGS. 6 and 7, the space 110 includes the cavity 111, the reservoir 112, and the communication hole 113. However, in the atom cell 21 of the frequency signal generation device 104, as illustrated in FIGS. 18 and 19, a space 110 does not include the reservoir 112 and the communication hole 113.

The space 110 includes the cavity 111.

The cavity 111 includes a first portion 150 and a second portion 152. In the illustrated example, the cavity 111 has a rectangular parallelepiped shape.

The inner surface 130 of the atom cell 21 includes a first surface 131 and a second surface 132. The first surface 131 defines walls of the cavity 111 in the −X axis direction. The second surface 132 defines walls of the cavity 111 in the +X axis direction.

The incident surface 140a which is the first region 140 is a part of the first surface 131. The second region 142 is a part of the first surface 131. That is, the incident surface 140a and the second region 142 in which there are the liquid alkali metal atoms 2 are located on the same plane. In the illustrated example, the liquid alkali metal atoms 2 are located in a region along the first surface 131. The exit surface 140b which is the first region 140 is a part of the second surface 132.

As illustrated in FIG. 19, the third region 144 is formed by a region between straight lines $L_B$ and $L_C$ of the first surface 131.

Here, when the atom cell 21 is viewed in a direction (the X axis direction) in which the light LL is incident on the cavity 111, a center O1 of the cavity 111 is different from a center O2 of the light LL in the cavity 111. The center O2 of the light LL is the center of the incident surface 140a. In the illustrated example, the center O2 is located from the center O1 in the −Y axis direction.

In the example illustrated in FIG. 19, when the −Y axis direction is the direction in which gravity acts, the liquid alkali metal atoms 2 in the second region 142 move to the third region 144 because of gravity. Accordingly, the marker 80 indicates the −Y axis direction.

In the frequency signal generation device 104, the center O1 of the cavity 111 is different from the center O2 of the light LL in the cavity 111 when viewed in the direction (the X axis direction) in which the light LL is incident on the cavity 111. Therefore, in the frequency signal generation device 104, the liquid alkali metal atoms 2 can be disposed on the opposite side (the +Y axis direction) to the side (the −Y axis direction) on which the center O2 is shifted from the center O1 when viewed in the X axis direction. In other words, when viewed in the direction in which the light LL is incident on the atom cell 21, a distance between the center O2 of the first portion 150 and the liquid alkali metal atoms 2 is greater than a distance between the center O2 of the first portion 150 and the center O1 of the cavity 111. Thus, in the frequency signal generation device 104, a distance between the light LL and the liquid alkali metal atoms 2 can be increased. The distance between the liquid alkali metal atoms 2 and a certain point is a shortest distance connecting this point to the surface of the liquid alkali metal atoms 2.

In the atom cell 21 including the reservoir 112, the distance between the center O2 of the first portion 150 and the liquid alkali metal atoms 2 may be greater than the distance between the center O2 of the first portion 150 and the center O1 of the cavity 111 when viewed in the direction in which the light LL is incident on the atom cell 21.

2. Second Embodiment

2.1. Frequency Signal Generation Device

Figure 20:
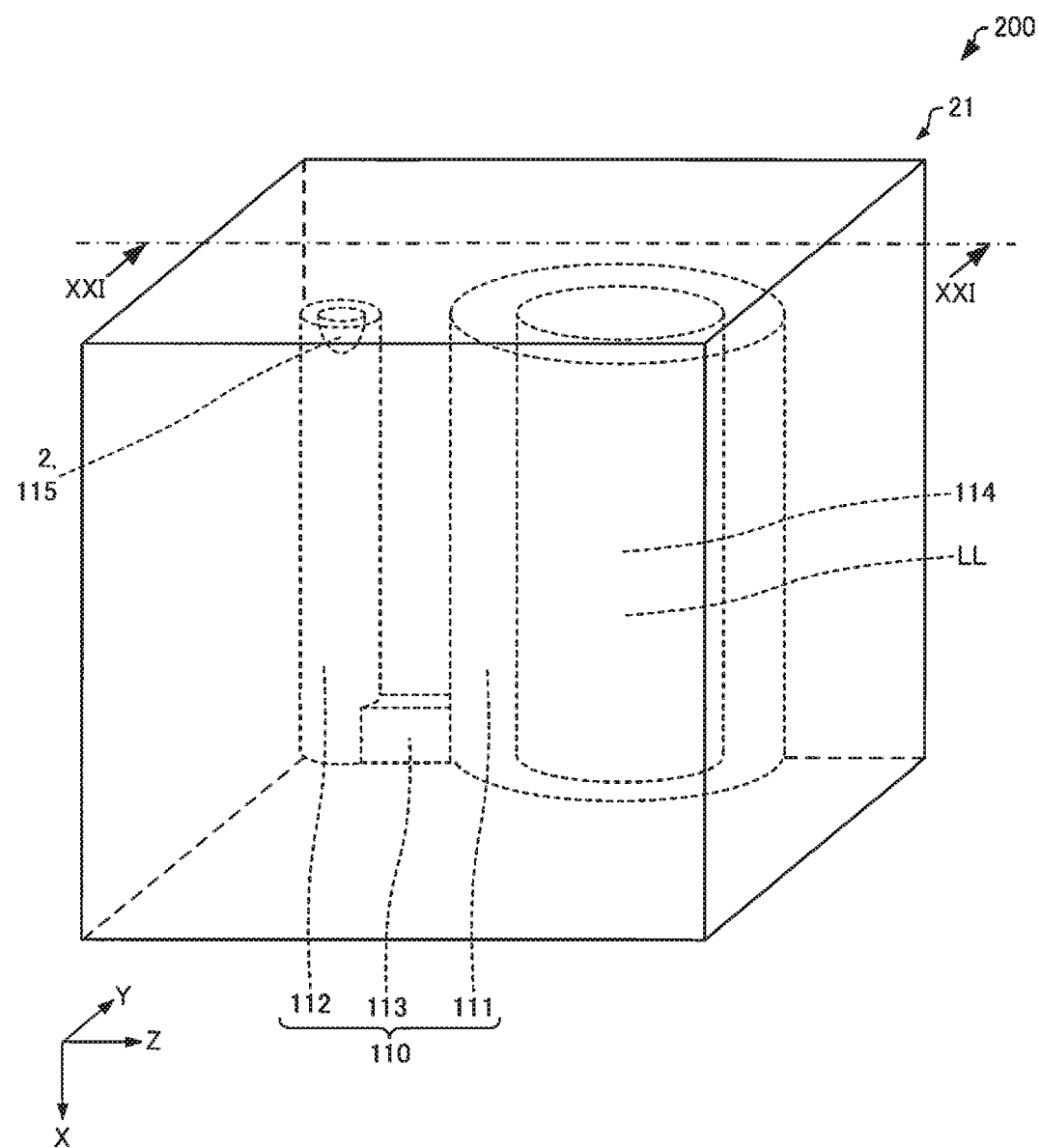
FIG. 20 is a perspective view schematically illustrating an atom cell of a frequency signal generation device according to a second embodiment.
Figure 21:
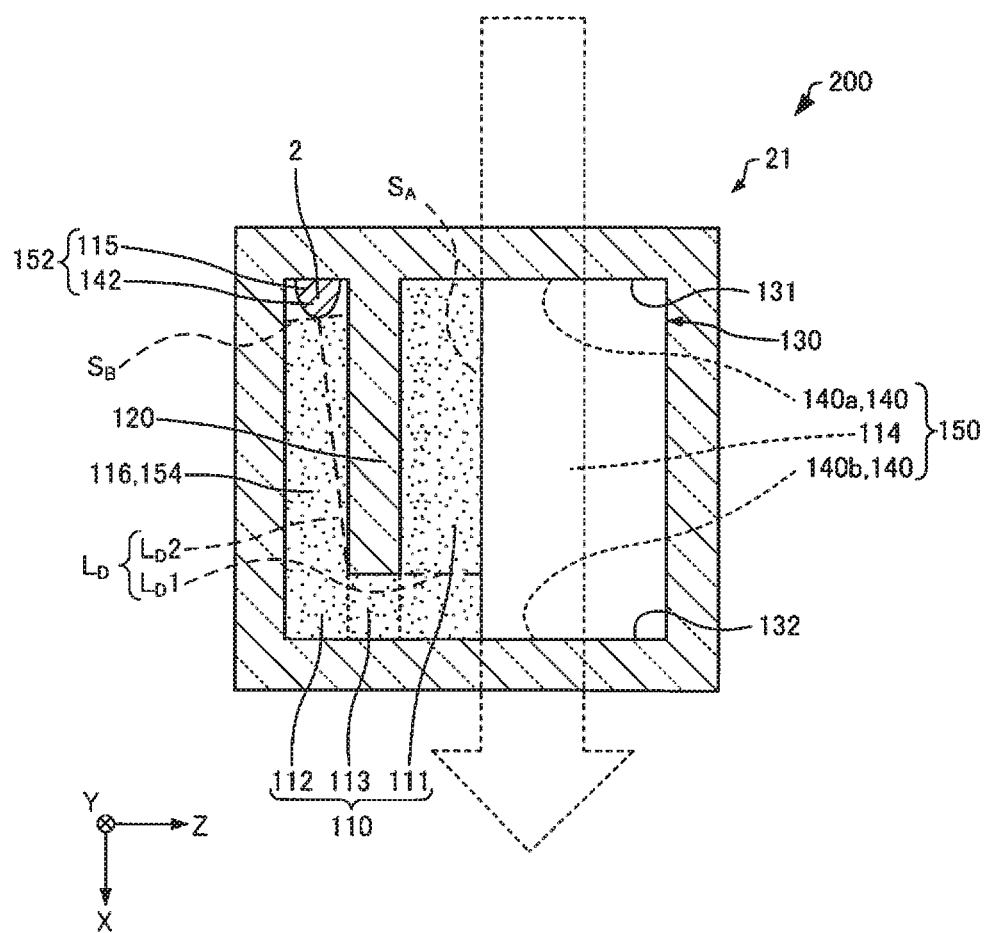
FIG. 21 is a sectional view schematically illustrating the atom cell of the frequency signal generation device according to the second embodiment.

Next, a frequency signal generation device 200 according to a second embodiment will be described with reference to the drawings. FIG. 20 is a perspective view schematically illustrating the atom cell 21 of the frequency signal generation device 200 according to the second embodiment. FIG. 21 is a sectional view taken along the line XXI-XXI of FIG. 20 schematically illustrating the atom cell 21 of the frequency signal generation device 200 according to the second embodiment.

Hereinafter, different points between the frequency signal generation device 100 according to the above-described embodiment and the frequency signal generation device 200 according to the second embodiment will be described and the same points therebetween will be omitted.

In the above-described frequency signal generation device 100, the liquid alkali metal atoms 2 are moved along the inner surface 130 of the atom cell 21 when the frequency signal generation device 100 is disposed vertically (the state in which the surface 42 is oriented in the gravity direction). However, in the frequency signal generation device 200, for example, an amount of liquid alkali metal atoms 2 is greater than that of the frequency signal generation device 100. Therefore, when the frequency signal generation device 200 is disposed vertically, the liquid alkali metal atoms 2 move into the space 110 without moving along the inner surface 130 in some cases.

In the frequency signal generation device 200, as illustrated in FIG. 21, the liquid alkali metal atoms 2 are provided on the fifth surface (part of 131) defining a wall (top) of the reservoir 112 in the −X axis direction.

As illustrated in FIGS. 20 and 21, the space 110 includes a third space portion 116 connecting a first space portion 114 to a second space portion 115. In the frequency signal generation device 200, the third portion 154 is the third space portion 116.

Here, "the third space portion 116 connecting the first space portion 114 to the second space portion 115" is a portion of the space 110 located between the first space portion 114 and the second space portion 115. The third space portion 116 may be said to be a portion of the space 110 which reaches from one of the first space portion 114 and the second space portion 115 through the space 110 to the other thereof. For example, from the viewpoint of a shortest path connecting the first space portion 114 to the second space portion 115, the third space portion 116 is a space through which a line $L_D$ connecting the first space portion 114 to the second space portion 115 in a shortest distance passes and is a region between a plane $S_A$ and a plane $S_B$. In the illustrated example, the line $L_D$ includes a line segment $L_D1$ and a line segment $L_D2$. The plane $S_A$ includes a connection point between the line $L_D$ and the first portion 114 and is a plane that has a straight line (in the illustrated example, a line segment $L_D1$) passing the connection point of the line $L_D$ as a normal line and touches the first space portion 114. The plane $S_B$ includes a connection point between the line $L_D$ and the liquid alkali metal atoms 2 and is a plane that has a straight line (in the illustrated example, a line segment $L_D2$) passing the connection point of the line $L_D$ as a normal line and touches the liquid alkali metal atoms 2.

In the illustrated example, the third space portion 116 includes a region of the cavity 111 from the plane $S_A$ in the −Z axis direction, a region of the reservoir 112 from the plane $S_B$ in the +X axis direction, and the communication hole 113.

The marker 80 indicates a direction in which the liquid alkali metal atoms 2 in the second space portion 115 move to the third space portion 116 because of gravity when the surface 42 of the substrate 40 is oriented in the gravity direction.

In the example illustrated in FIG. 21, when the +X axis direction is a direction in which gravity acts, the liquid alkali metal atoms 2 of the second space portion 115 move to the third space portion 116 because of gravity. Accordingly, the marker 80 indicates the +X axis direction.

In the frequency signal generation device 200, the marker 80 indicates a direction in which the liquid alkali metal atoms 2 in the second space portion 115 move to the third space portion 116 because of gravity when the surface 42 is oriented in the gravity direction. Therefore, the user can recognize the direction in which the liquid alkali metal atoms 2 move because of gravity. Accordingly, in the frequency signal generation device 200, the marker 80 can assist the user so that the user can recognize the direction of the disposition in which the liquid alkali metal atoms 2 rarely move into the light passage portion 114 because of gravity.

In the embodiment of the invention, when the surface 42 is oriented in the gravity direction, there are a case in which the liquid alkali metal atoms 2 move along the third region 144 of the inner surface 130, a case in which the liquid alkali metal atoms 2 move through the third space portion 116, and a case in which the liquid alkali metal atoms 2 move along the third region 144 to move through the third space portion 116 from the halfway portion. Accordingly, the marker 80 indicates the direction in which the liquid alkali metal atoms 2 move to the third portion 154 because of gravity when the surface 42 is oriented in the gravity direction. The third portion 154 connecting the first portion 150 to the second portion 152 is at least one of the third region 144 and the third space portion 116.

2.2. Modification Example of Frequency Signal Generation Device

Figure 22:
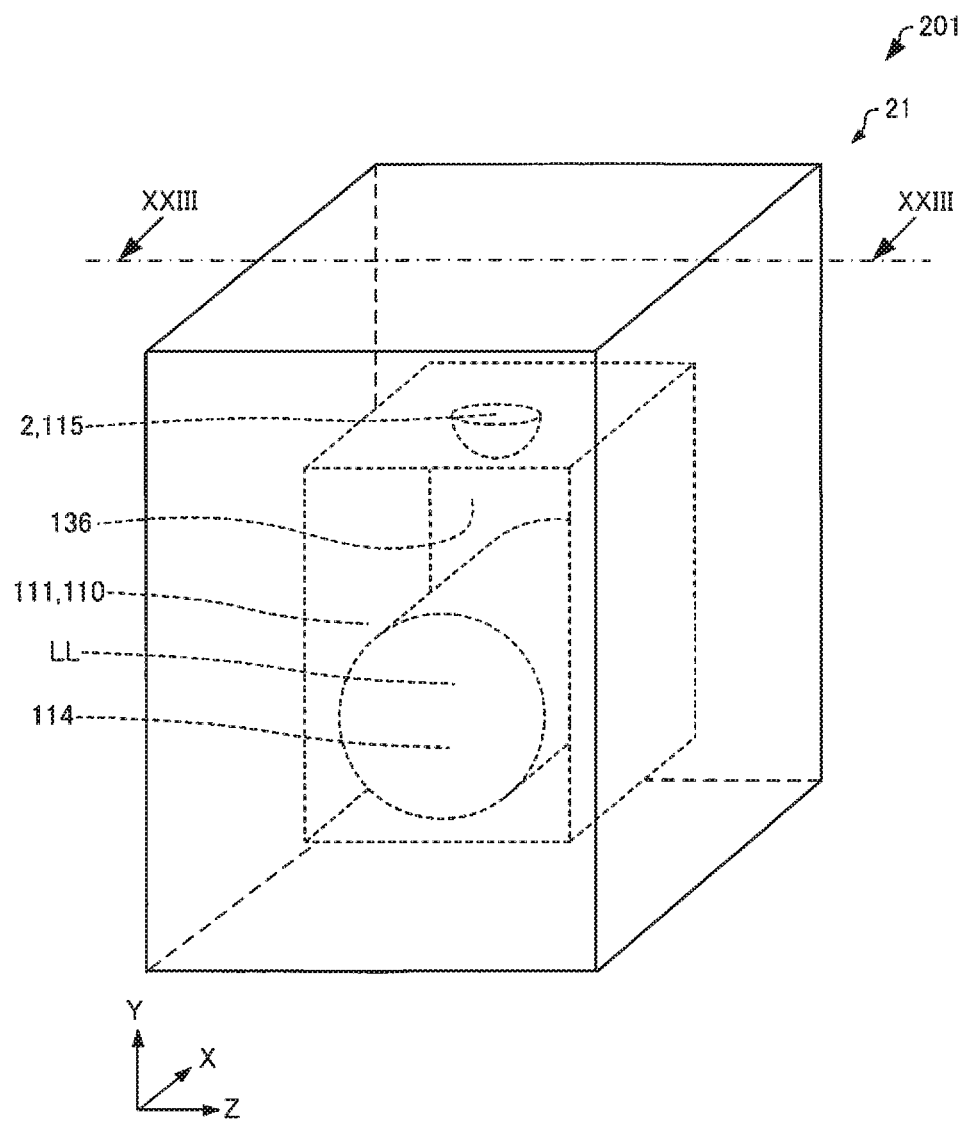
FIG. 22 is a perspective view schematically illustrating an atom cell of a frequency signal generation device according to a modification example of the second embodiment.
Figure 23:
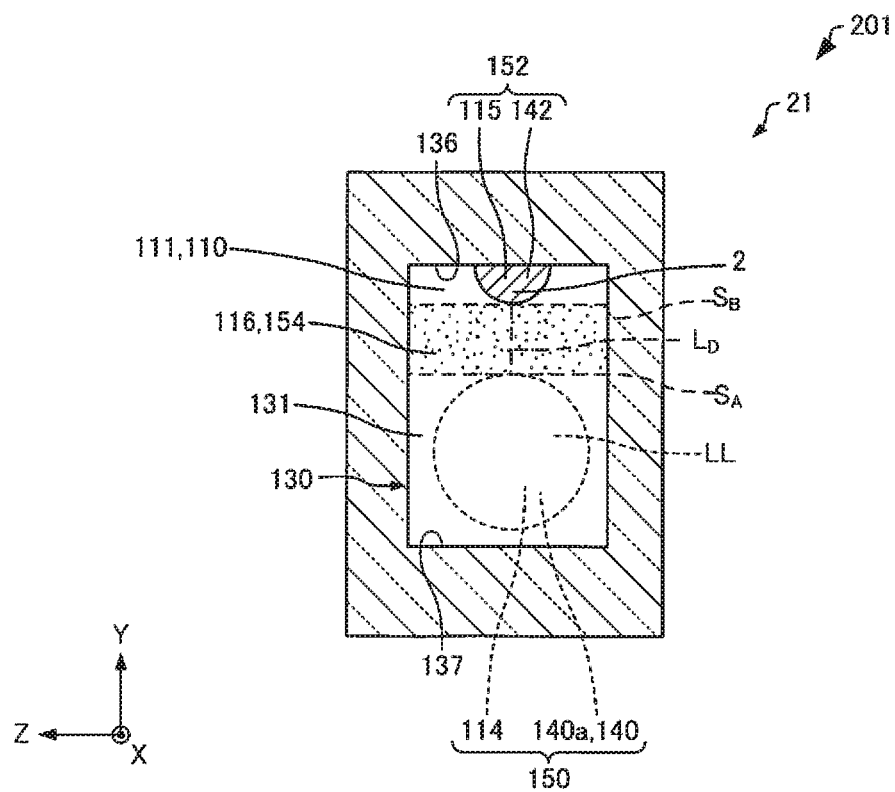
FIG. 23 is a sectional view schematically illustrating the atom cell of the frequency signal generation device according to the modification example of the second embodiment.

Next, a frequency signal generation device 201 according to a modification example of the second embodiment will be described with reference to the drawings. FIG. 22 is a perspective view schematically illustrating the atom cell 21 of the frequency signal generation device 201 according to the modification example of the second embodiment. FIG. 23 is a sectional view taken along the line XXIII-XXIII of FIG. 22 schematically illustrating the atom cell 21 of the frequency signal generation device 201 according to the modification example of the second embodiment.

Hereinafter, different points between the frequency signal generation devices 100 and 200 according to the above-described embodiments and the frequency signal generation device 201 according to the modification example of the second embodiment will be described and the same points therebetween will be omitted.

The frequency signal generation device 201 is different from the above-described frequency signal generation device 200 in the shape of the atom cell 21, as illustrated in FIGS. 22 and 23.

The shape of the atom cell 21 of the frequency signal generation device 201 is the same as that of the atom cell 21 of the above-described frequency signal generation device 104. The inner surface 130 of the atom cell 21 includes a sixth surface 136 and a seventh surface 137 connecting the first surface 131 to the second surface 132. For example, the sixth surface 136 and the seventh surface 137 are parallel to each other. The liquid alkali metal atoms 2 are provided on the sixth surface 136.

In the frequency signal generation device 201, a line $L_D$ connecting the first space portion 114 to the second space portion 115 in a shortest distance is a straight line. In the illustrated example, the third space portion 116 has a rectangular parallelepiped shape. In the example illustrated in FIG. 23, the liquid alkali metal atoms 2 in the second space portion 115 move to the third space portion 116 because of gravity when the +X axis direction is a direction in which gravity acts. Accordingly, the marker 80 indicates the −Y axis direction.

For example, when the liquid alkali metal atoms 2 move from the sixth surface 136 to the seventh surface 137, the liquid alkali metal atoms 2 block the light LL in some cases.

3. Third Embodiment

Figure 24:
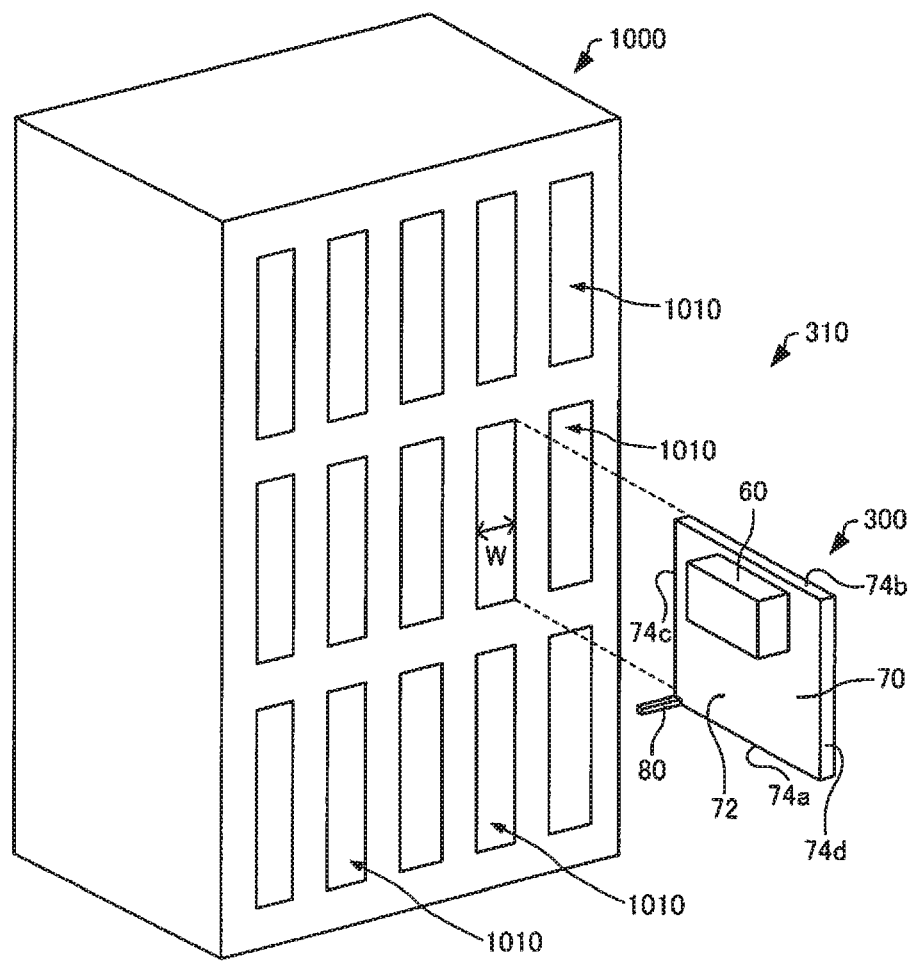
FIG. 24 is a perspective view schematically illustrating a frequency signal generation device according to a third embodiment.

Next, a frequency signal generation device 300 according to a third embodiment will be described with reference to the drawings. FIG. 24 is a perspective view schematically illustrating the frequency signal generation device 300 according to the third embodiment.

Hereinafter, different points between the example of the frequency signal generation device 100 according to the above-described embodiment and the frequency signal generation device 300 according to the third embodiment will be described and the same points therebetween will be omitted.

In the above-described frequency signal generation device 100, as illustrated in FIG. 4, the marker 80 is the display member on which at least one of the text and the symbol is displayed. However, in the frequency signal generation device 300, the marker 80 is a structure installed to the disposition substrate 70, as illustrated in FIG. 24. The marker 80 can be said to be a structure attached to the disposition substrate 70. On the marker 80 which is the structure, text and a symbol may be attached or may not be attached.

The marker 80 is, for example, a rod-like structure protruding from the disposition substrate 70 in the thickness direction of the disposition substrate 70. In the illustrated example, the disposition substrate 70 is rectangular parallelepiped. The disposition substrate 70 includes a main surface 72 on which the package 60 is disposed and end surfaces 71a, 74b, 74c, and 74d connected to the main surface 72. For example, the main surface 72 is parallel to the surface 42 (see FIG. 2) of the substrate 40. For example, the first end surface 74a is parallel to the second end surface 74b. For example, the third end surface 74c is parallel to the fourth end surface 74d. The marker 80 includes, for example, a surface continuous with the first end surface 74a and a surface continuous with the third end surface 74c. The marker 80 protrudes from the main surface 72.

FIG. 24 illustrates a rack 1000 in which a plurality of openings 1010 are formed. The frequency signal generation device 300 is inserted vertically into the opening 1010.

A sum of the thickness of the disposition substrate 70 and the length of the marker 80 in the protrusion direction is greater than a horizontal width (a width of the main surface 72 in the normal direction) W of the opening 1010. Accordingly, as illustrated in FIG. 24, when the frequency signal generation device 300 is inserted into the opening 1010 so that the third end surface 74c is oriented toward the opening 1010, the marker comes into contact with the rack 1000 to prevent the frequency signal generation device 300 from being inserted into the opening 1010. A direction in which the third end surface 74c is oriented toward the opening 1010 is a direction (a forbidden direction) in which the liquid alkali metal atoms 2 move into the light passage portion 114 because of gravity when the frequency signal generation device 300 is oriented vertically. Accordingly, in the frequency signal generation device 300, the marker 80 can serve as a stopper to notify the user of the forbidden direction.

In this way, the marker 80 serves as a stopper that comes into contact with the rack 1000 to prevent the frequency signal generation device 300 from being inserted into the opening 1010 when the surface 42 (see FIG. 2) of the substrate 40 is oriented in the gravity direction and the frequency signal generation device 300 is inserted into the opening 1010 formed in the rack 1000 and when the liquid alkali metal atoms 2 move in the direction of the first portion 114 because of gravity. The stopper enables the user to easily recognize the direction in which the liquid alkali metal atoms 2 move to the third space portion 116 because of gravity when the surface 42 is oriented in the gravity direction.

In the illustrated example, when the frequency signal generation device 300 is inserted so that the second end surface 74b or the fourth end surface 74d is oriented toward the opening 1010, the marker 80 does not come into contact with the rack 1000 at a position at which the frequency signal generation device 300 is prevented from being inserted into the opening 1010.

As illustrated in FIG. 23, the frequency signal generation device 300 and the rack 1000 may form a frequency signal generation system 310.

Figure 25:
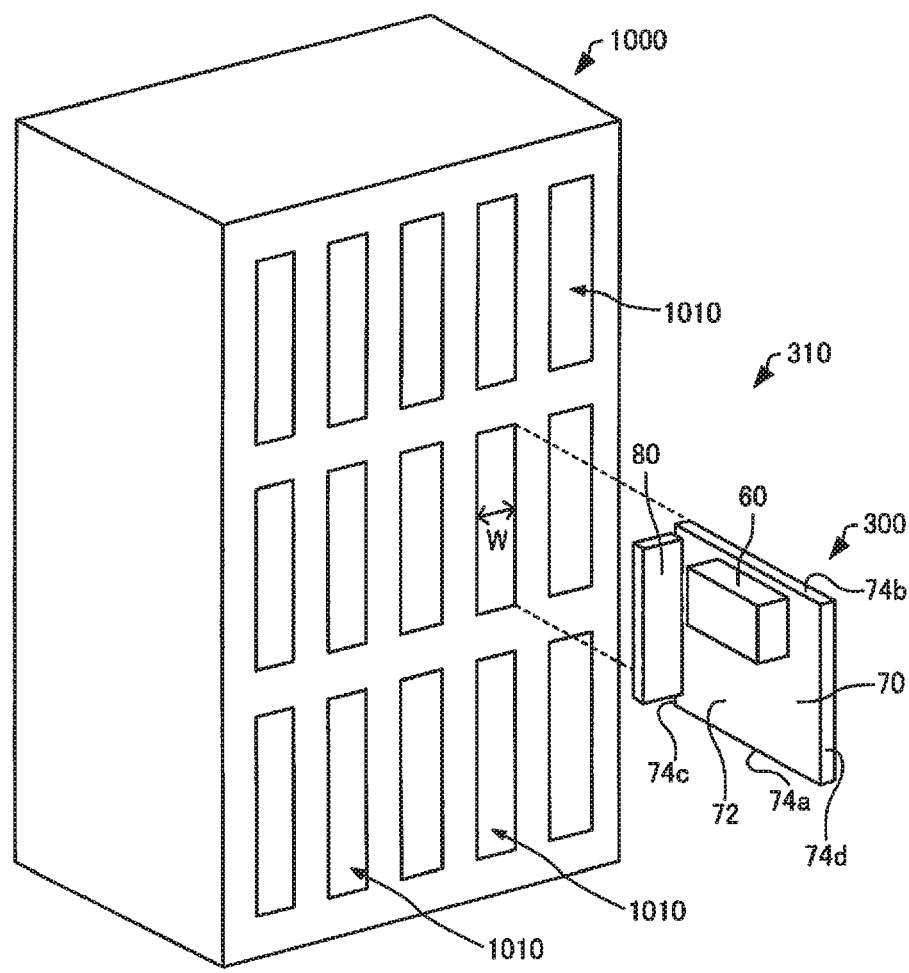
FIG. 25 is a perspective view schematically illustrating the frequency signal generation device according to the third embodiment.

The marker 80 is not limited to the rod-like shape. For example, as illustrated in FIG. 25, the marker 80 may be a plate-shaped member installed along the third end surface 74*c*. The marker 80 may be installed on a surface other than the main surface 72 of the disposition substrate 70 and has any shape as long as functioning as a stopper (key).

Figure 26:
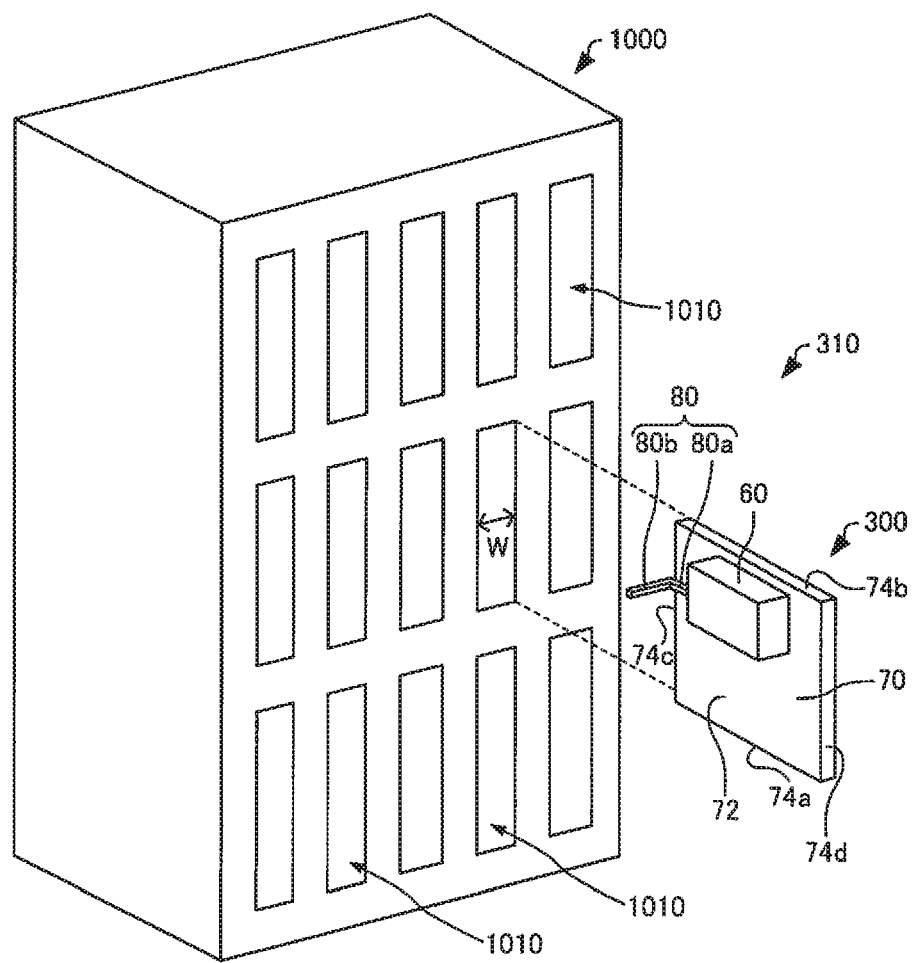
FIG. 26 is a perspective view schematically illustrating the frequency signal generation device according to the third embodiment.

As illustrated in FIG. 26, the marker 80 may be installed on the package 60. In the illustrated example, the marker 80 includes a portion 80*a* extending in a planar direction of the main surface 72 and a portion 80*b* extending in the normal direction of the main surface 72.

Figure 27:
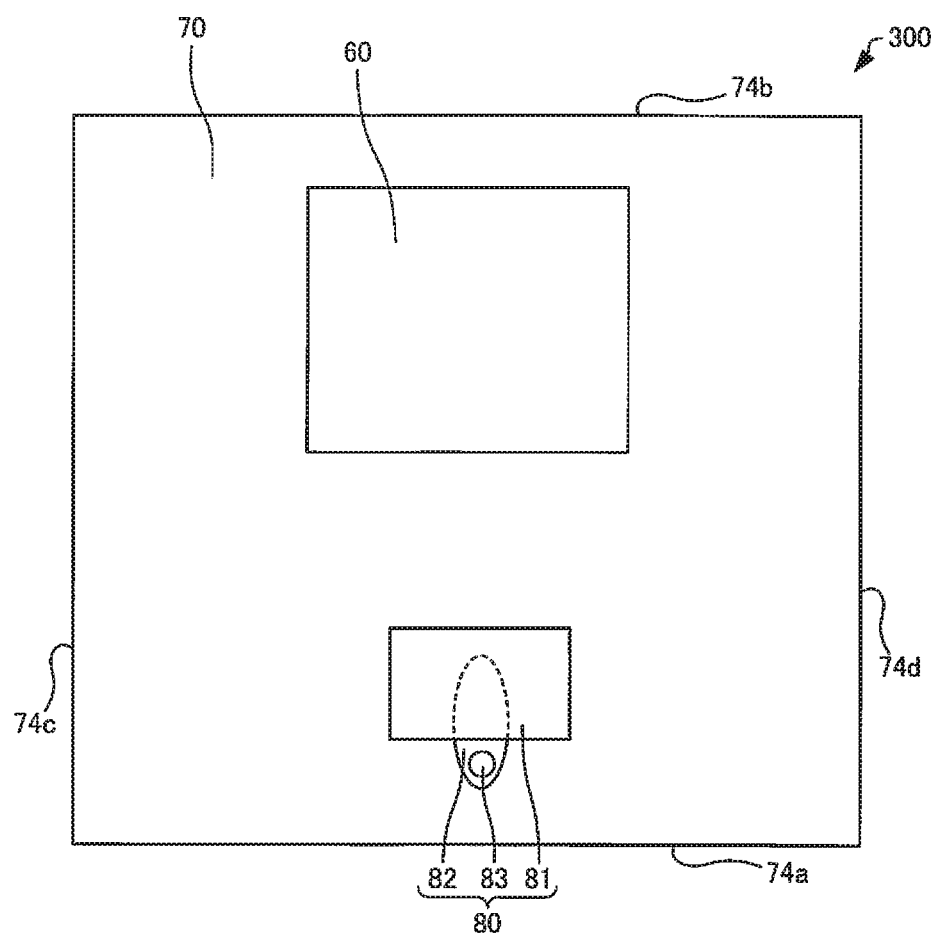
FIG. 27 is a plan view schematically illustrating the frequency signal generation device according to the third embodiment.

As illustrated in FIG. 27, the marker 80 may include a transparent container 81 formed of glass or the like, a coating member 82 that coats apart of the transparent container 81, and a ball 83 that is accommodated inside the transparent container 81. The ball 83 may move to a position that does not overlap the coating member 82 when the frequency signal generation device 300 is inserted into the opening 1010 so that the third end surface 74*c* is oriented toward the opening 1010. The marker 80 may notify the user of the forbidden direction when the ball 83 is viewed by the user.

4. Fourth Embodiment

Figure 28:
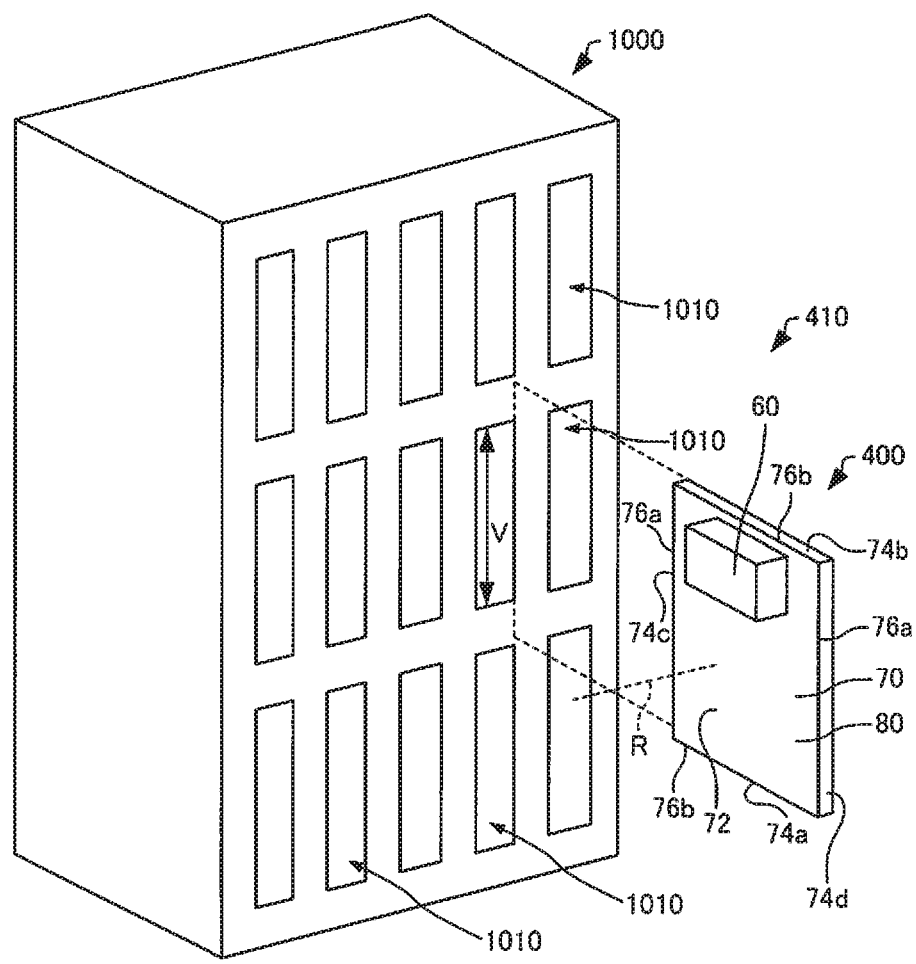
FIG. 28 is a perspective view schematically illustrating a frequency signal generation device according to a fourth embodiment.

Next, a frequency signal generation device 400 according to a fourth embodiment will be described with reference to the drawings. FIG. 28 is a perspective view schematically illustrating the frequency signal generation device 400 according to the fourth embodiment.

Hereinafter, different points between the example of the frequency signal generation devices 100 and 300 according to the above-described embodiments and the frequency signal generation device 400 according to the fourth embodiment will be described and the same points therebetween will be omitted.

In the above-described frequency signal generation device 100, as illustrated in FIG. 4, the marker 80 is the display member on which at least one of the text and the symbol is displayed. Thus, in the frequency signal generation device 400, the marker 80 is the disposition substrate 70, as illustrated in FIG. 28.

When viewed in the direction of a normal line R of the main surface 72, the disposition substrate 70 has a rectangle shape that has a long side 76*a* and a short side 76*b*. The length of the long side 76*a* is greater than a vertical width (a width in the longitudinal direction) V of the opening 1010. The length of the short side 76*b* is equal to or less than the vertical width V of the opening 1010. The long side 76*a* is a connection portion between the main surface 72 and the third end surface 74*c* and is a connection portion between the main surface 72 and the fourth end surface 74*d*. The short side 76*b* is a connection portion between the main surface 72 and the first end surface 74*a* and is a connection portion between the main surface 72 and the second end surface 74*b*. Accordingly, when the frequency signal generation device 400 is inserted into the opening 1010 so that the third end surface 74*c* is oriented toward the opening 1010, the disposition substrate 70 comes into contact with the rack 1000. Therefore, the disposition substrate 70 serves as a marker indicating the forbidden direction to notify the user of the forbidden direction.

In the illustrated example, when the frequency signal generation device 400 is inserted into the opening 1010 so that the first end surface 74*a* or the second end surface 74*b* is oriented toward the opening 1010, the marker 80 does not come into contact with the opening 1010 of the rack 1000.

The shape of the disposition substrate 70 when viewed in the direction of the normal line R is not limited to the rectangle as long as the disposition substrate 70 is maintained in the opening 1010 of the rack 1000. An elliptical shape, a polygon with different lengths perpendicular in two directions (a rectangle with broken corners, a trapezoid, a hexagon, or the like), or the like may be used. When a maximum length of the disposition substrate 70 in a direction in which the liquid alkali metal atoms 2 move to the third portion 154 because of gravity is greater than the vertical width V of the opening 1010 of the rack 1000, that is, the length of the opening 1010 in the gravity direction in a view in the direction of the normal line R, the disposition substrate 70 functions as the marker 80.

When the maximum length of the disposition substrate 70 in the direction in which the liquid alkali metal atoms 2 move to the third portion 154 because of gravity is less than the vertical width V of the opening 1010 in a view in the direction of the normal line R, and the maximum length is less than a maximum length in a direction perpendicular to the direction of the disposition substrate 70, the rack 1000 may not stably hold the disposition substrate 70 when the forbidden direction is the longitudinal direction of the opening 1010. Accordingly, in this configuration, the user can recognize the direction in which the liquid alkali metal atoms 2 move in the direction of the third portion 154 because of gravity.

The frequency signal generation device 400 and the rack 1000 may form a frequency signal generation system 410, as illustrated in FIG. 28.

Figure 29:
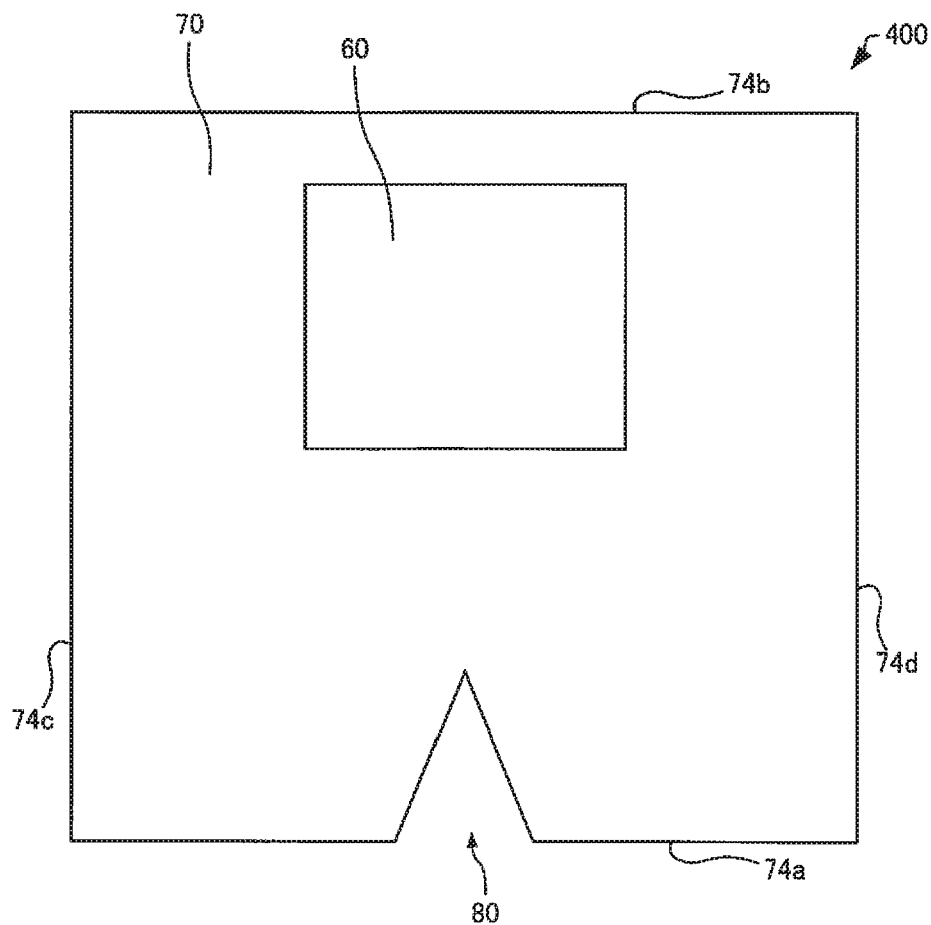
FIG. 29 is a plan view schematically illustrating the frequency signal generation device according to the fourth embodiment.

The marker 80 may be the disposition substrate 70 in which a notch is formed, as illustrated in FIG. 29. In the illustrated example, the notch is formed in the third end surface 74*c*. By notifying the user of a portion in which the notch is formed in advance so that the user does not insert the notched portion toward the opening 1010 of the rack 1000, the marker 80 serves as a marker indicating the forbidden direction.

The marker 80 may be the disposition substrate 70 that has an uneven structure or the like. Text or a symbol of the marker 80 may be directly attached to the disposition substrate 70. In this case, the disposition substrate 70 also serves as the marker 80.

5. Fifth Embodiment

Figure 30:
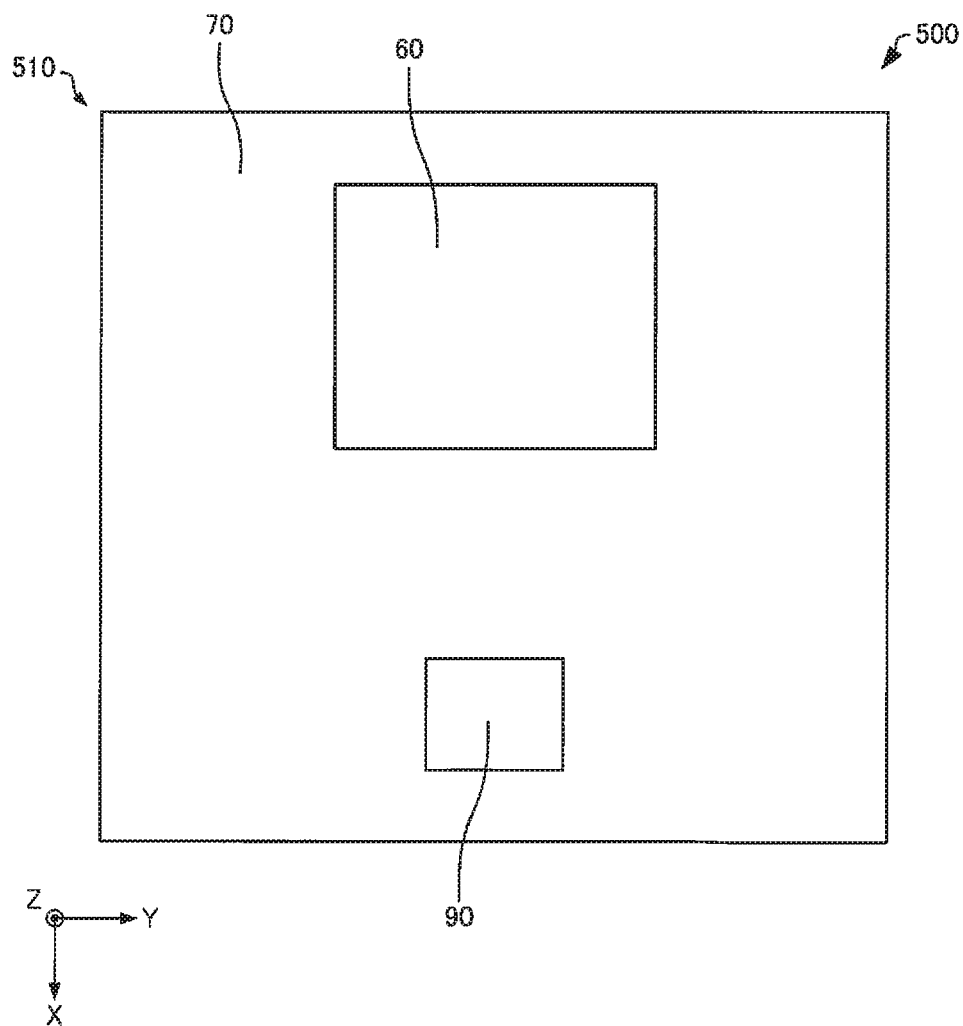
FIG. 30 is a plan view schematically illustrating a frequency signal generation system according to a fifth embodiment.
Figure 31:
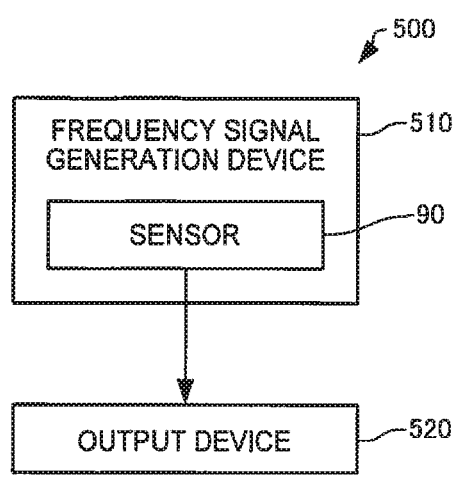
FIG. 31 is a functional block diagram illustrating the frequency signal generation system according to the fifth embodiment.

Next, a frequency signal generation system 500 according to a fifth embodiment will be described with reference to the drawings. FIG. 30 is a plan view schematically illustrating the frequency signal generation system 500 according to the fifth embodiment. FIG. 31 is a functional block diagram illustrating the frequency signal generation system 500 according to the fifth embodiment. In FIG. 30, the X, Y, and Z axes are illustrated as three axes which are orthogonal to each other.

The frequency signal generation system 500 includes a frequency signal generation device 510 including a sensor 90 and an output device 520, as illustrated in FIGS. 30 and 31. For convenience, the output device 520 is not illustrated in FIG. 30.

The frequency signal generation device 510 may include or may not include the marker 80 described in the other embodiments. In the illustrated example, the frequency signal generation device 510 is the same as the frequency signal generation device 100 except that the marker 80 is not included and the sensor 90 is included.

The sensor 90 is, for example, an acceleration sensor that detects a direction in which gravity acts. The sensor 90 is configured to output a signal to the output device 520 when the +X axis direction is the direction in which gravity acts.

Based on a detection result of the sensor 90, the output device 520 performs an output at least when the liquid alkali metal atoms 2 move to the third portion 154 because of gravity. The output device 520 is, for example, a display, a sound output device, or a lamp. The output device 520 is a notification unit that notifies the user based on the signal from the sensor 90. The output device 520 may notify the user in accordance with a sound or may notify the user by displaying text or the like on a display installed in the rack 1000 (see FIG. 24). The output device 520 may notify the user by lighting a lamp or blinking the lamp in a predetermined pattern.

The output device 520 may be installed in the frequency signal generation device 510 or may be included in a device different from the frequency signal generation device 510 that performs communication with the frequency signal generation device 510 through wired communication or wireless communication. Examples of the device include a timing server, a data center, a device that uses a frequency signal output by a frequency signal generation device such as a communication base station or the like, a personal computer (PC) that manages the frequency signal generation device, and a smartphone. When the output device 520 is included in the frequency signal generation device 510, the frequency signal generation device 510 is equivalent to the frequency signal generation system 500. When the output device 520 is different from the frequency signal generation device 510, a pair of the frequency signal generation device 510 and the output device 520 is equivalent to the frequency signal generation system 500.

A signal is output to a power circuit of the rack 1000 and the power circuit may turn off power of the rack 1000 based on the output signal to notify the user. In this case, the user may be notified that the power is turned off or the output device 520 may notify the user of error information indicating that the power of the frequency signal generation device 510 is turned off or a frequency signal may not be acquired. The foregoing two or more of the notification methods of the output device 520 may be combined.

The +X axis direction is a direction in which the liquid alkali metal atoms 2 in the second region 142 move to the third region 144 because of gravity. Accordingly, in the frequency signal generation system 500, the liquid alkali metal atoms 2 rarely move into the light passage portion 114 because of gravity.

In the illustrated example, the sensor 90 is installed on the disposition substrate 70. Although not illustrated, the sensor 90 may be installed on the package 60 or may be installed inside the package 60.

The frequency signal generation system 500 includes the sensor 90 that detects the direction in which gravity acts and the output device 520 that performs an output based on a detection result of the sensor 90 when the liquid alkali metal atoms 2 move to the third portion 154 because of gravity. Therefore, the frequency signal generation system 500 can assist the user so that the user can recognize the direction of the disposition in which the liquid alkali metal atoms 2 rarely move to the first portion 150 because of gravity.

6. Sixth Embodiment

Figure 32:
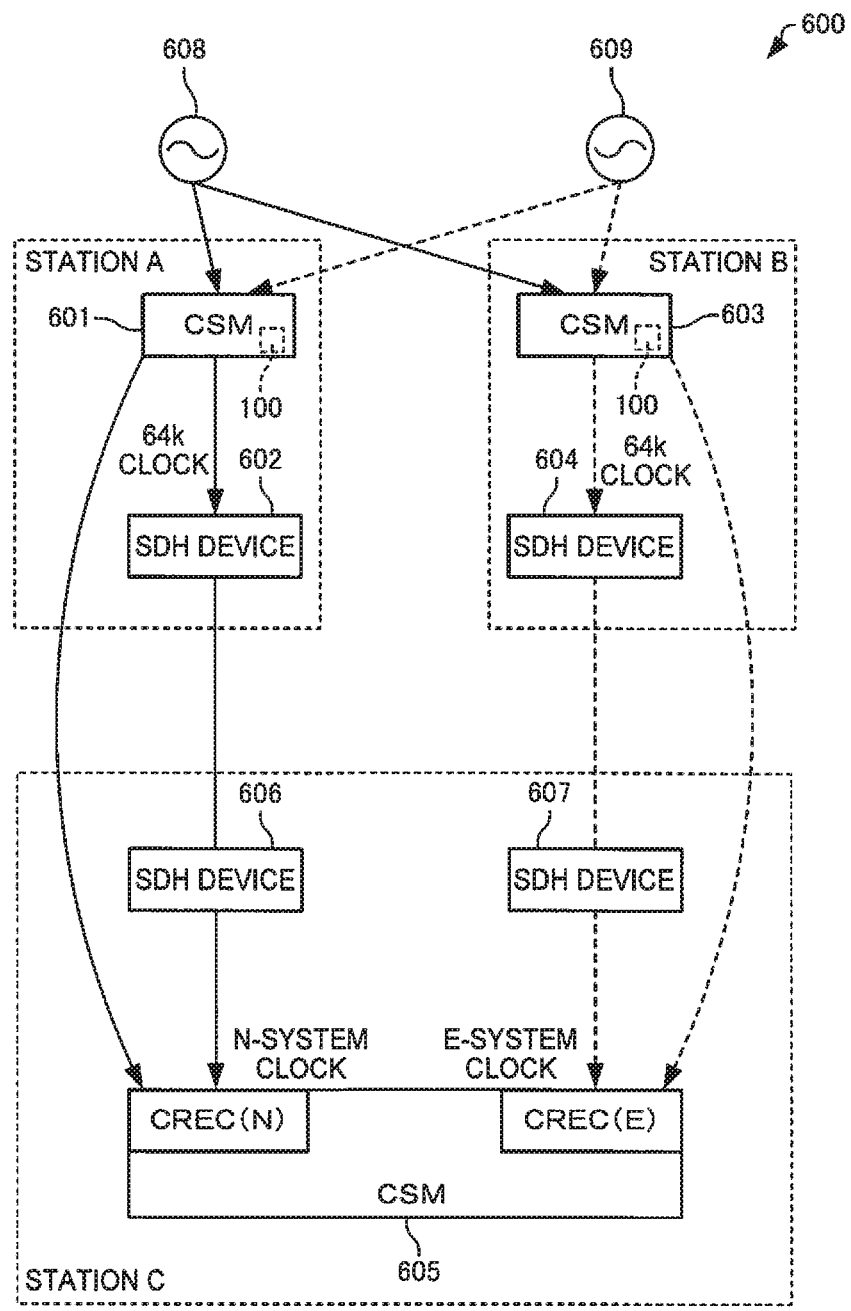
FIG. 32 is a schematic diagram illustrating a configuration of a clock transmission system according to a sixth embodiment.

Next, a clock transmission system (timing server) 600 according to a sixth embodiment will be described with reference to the drawings. FIG. 32 is a diagram schematically illustrating the clock transmission system 600.

The clock transmission system according to the invention includes a frequency signal generation device according to the invention. Hereinafter, as an example, the clock transmission system 600 including the frequency signal generation device 100 will be described. The clock transmission system can be said to be a frequency signal generation system.

The clock transmission system 600 is a system that matches clocks of devices in a network in conformity to a time division multiplexing scheme and has a redundant configuration of a normal (N) system and an emergency (E) system.

As illustrated in FIG. 32, the clock transmission system 600 includes a clock supply module (CSM) 601 and a synchronous digital hierarchy (SDH) device 602 of a station A (high-order (N system)), a clock supply module 603 and an SDH device 604 of a station B (high-order (E system)), and a clock supply module 605 and SDH devices 606 and 607 of a station C (low-order). The stations A and B may be configured by the rack 1000 (see FIG. 24) in which the frequency signal generation device 100 is inserted into the opening 1010. The clock supply module 601 includes the frequency signal generation device 100 and generates an N-system clock signal. The frequency signal generation device 100 in the clock supply module 601 generates a clock signal in synchronization with a clock signal with higher precision from a master clock 608 or 609 including an atomic oscillator that uses cesium.

The SDH device 602 transmits and receives a main signal based on the clock signal from the clock supply module 601 and superimposes the N-system clock signal on the main signal to transmit the N-system clock signal to the lower-order clock supply module 605. The clock supply module 603 includes the frequency signal generation device 100 and generates an E-system clock signal. The frequency signal generation device 100 in the clock supply module 603 generates a clock signal in synchronization with a clock signal with higher precision from the master clock 608 or 609 that includes an atomic oscillator that uses cesium.

The SDH device 604 transmits and receives a main signal based on the clock signal from the clock supply module 603 and superimposes the E-system clock signal on the main signal to transmit the E-system clock signal to the lower-order clock supply module 605. The clock supply module 605 receives the clock signals from the clock supply modules 601 and 603 and generates clock signals in synchronization with the received clock signals.

The clock supply device 605 normally generates a clock signal in synchronization with the N-system clock signal from the clock supply module 601. When abnormality occurs in the N system, the clock supply module 605 generates a clock signal in synchronization with the E-system clock signal from the clock supply module 603. In this way, by switching from the N system to the E system, it is possible to ensure stable clock supply and improve reliability of a clock pass network. The SDH device 606 transmits and receives the main signal based on the clock signal from the clock supply module 605. Similarly, the SDH device 607 transmits and receives the main signal based on the clock signal from the clock supply module 605. Thus, the devices of the station C can be synchronized with the devices of the station A or B.

In the embodiment of the invention, some of the configurations may be omitted within a range of features or advantages described in the present specification or each embodiment and each modification example may be combined.

The invention includes configurations (for example, configurations with the same functions, methods, and results or configurations with the same purposes and advantages) which are substantially the same configurations described in the embodiments. The invention includes configurations in which portions which are not fundamental in the configurations described in the embodiments are substituted. The invention includes configurations in which the same operational effects as the configuration described in the embodiment are obtained or configurations in which the same purposes can be achieved. The invention includes configurations in which known technologies are added to the configurations described in the embodiments.

The entire disclosure of Japanese Patent application No. 2017-168094 filed Aug. 31, 2017 is expressly incorporated by reference herein.

What is claimed is:

1. A frequency signal generation device comprising:
   a substrate;
   a light source disposed on a surface of the substrate;
   an atom cell disposed on the surface of the substrate, the atom cell containing gaseous alkali metal atoms and including:
      a first portion through which light emitted from the light source passes;
      a second portion housing liquid alkali metal atoms; and
      a third portion fluidly connecting the first portion to the second portion;
   a marker that indicates a direction in which the liquid alkali metal atoms move toward the third portion by gravity when the surface is vertically oriented,
   a container that accommodates the substrate, the light source, and the atom cell; and
   a disposition substrate on which the container is disposed,
   wherein the marker is a structural member installed to the disposition substrate, and
   when the frequency signal generation device is inserted into an opening formed in a rack by orienting the surface such that the liquid alkali metal atom moves to the third portion due to gravity, the structural member abuts the rack and hinders the frequency signal generation device from being inserted into the opening.

2. The frequency signal generation device according to claim 1,
   wherein the atom cell further includes an inner surface defining a space containing the gaseous alkali metal atoms and the liquid alkali metal atoms,
   wherein the first portion includes:
      a first region of the inner surface through which the light passes; and
      a first space portion of the space through which the light passes,
   wherein the second portion includes:
      a second region of the inner surface housing the liquid alkali metal atoms; and
      a second space portion of the space housing the liquid alkali metal atoms, and
   wherein the third portion is at least one of:
      a third region of the inner surface connecting the first region to the second region; or
      a third space portion of the space connecting the first space portion to the second space portion.

3. The frequency signal generation device according to claim 1,
   wherein the atom cell includes a cavity through which the light emitted from the light source passes and a reservoir housing the liquid alkali metal atoms.

4. The frequency signal generation device according to claim 3,
   wherein the atom cell includes a wall between the cavity and the reservoir, and
   wherein a hole fluidly connecting the cavity to the reservoir is in the wall.

5. The frequency signal generation device according to claim 1,
   wherein the atom cell includes a cavity including the first portion and the second portion, and
   wherein when viewed in a direction in which the light is incident on the atom cell, a distance between a center of the first portion and the liquid alkali metal atoms is greater than a distance between the center of the first portion and a center of the cavity.

6. A frequency signal generation system comprising:
   a substrate;
   a light source disposed on a surface of the substrate;
   an atom cell disposed on the surface of the substrate, the atom cell containing gaseous alkali metal atoms and including:
      a first portion through which light emitted from the light source passes;
      a second portion housing liquid alkali metal atoms; and
      a third portion fluidly connecting the first portion to the second portion;
   a sensor that detects a direction in which gravity acts; and
   an output device outputting an output based on a detection result of the sensor when the liquid alkali metal atoms move toward the third portion because of gravity.

7. A frequency signal generation system comprising:
   a frequency signal generation device including:
      a substrate;
      a light source disposed on a surface of the substrate;
      an atom cell disposed on the surface of the substrate, the atom cell containing gaseous alkali metal atoms and including:
         a first portion through which light emitted from the light source passes;
         a second portion housing liquid alkali metal atoms; and
         a third portion fluidly connecting the first portion to the second portion;
      a container that accommodates the substrate, the light source, and the atom cell,
      a disposition substrate on which the container is disposed, and
      a stopper that is installed on the disposition substrate; and
   a rack that includes an opening into which the frequency signal generation device is inserted by vertically orienting the surface of the substrate,
   wherein the stopper abuts against the rack to hinder the frequency signal generation device from being inserted into the opening when the frequency signal generation device is inserted into the opening at an orientation in which a movement direction of the liquid alkali metal atoms toward the third portion because of gravity is oriented along a direction in which gravity acts.

8. A frequency signal generation system comprising:
a frequency signal generation device including:
  a substrate;
  a light source disposed on a surface of the substrate;
  an atom cell disposed on the surface of the substrate, the atom cell containing gaseous alkali metal atoms and including:
    a first portion through which light emitted from the light source passes;
    a second portion housing liquid alkali metal atoms; and
    a third portion fluidly connecting the first portion to the second portion;
  a container that accommodates the substrate, the light source, and the atom cell, and
  a disposition substrate on which the container is disposed and faces the substrate; and
a rack that includes an opening into which the frequency signal generation device is inserted by orienting the surface of the substrate along a gravity direction, wherein when viewed in a normal direction of a surface of the disposition substrate on which the container is disposed, a length of the disposition substrate in a first direction which coincides with a movement direction of the liquid alkali metal atoms toward the third portion because of gravity is different from a length of the disposition substrate in a second direction perpendicular to the normal direction and the first direction, and wherein a difference between the length in the first direction and a length in a longitudinal direction of the opening is greater than a difference between the length in the second direction and the length in a longitudinal direction of the opening.

* * * * *